US012738231B2

(12) United States Patent
Yuan et al.

(10) Patent No.: US 12,738,231 B2
(45) Date of Patent: Sep. 15, 2026

(54) DISPLAY SUBSTRATE HAVING SCANNING LINE WITH SCANNING CONDUCTIVE LAYERS ARRANGED IN LAMINATED MANNER, METHOD FOR MANUFACTURING THE SAME, AND DISPLAY DEVICE HAVING THE SAME

(71) Applicants: HEFEI BOE JOINT TECHNOLOGY CO., LTD., Hefei (CN); BOE TECHNOLOGY GROUP CO., LTD, Beijing (CN)

(72) Inventors: Can Yuan, Beijing (CN); Yongqian Li, Beijing (CN); Zhidong Yuan, Beijing (CN); Luke Ding, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 541 days.

(21) Appl. No.: 18/262,124

(22) PCT Filed: Aug. 5, 2022

(86) PCT No.: PCT/CN2022/110479
§ 371 (c)(1),
(2) Date: Jul. 19, 2023

(87) PCT Pub. No.: WO2023/024870
PCT Pub. Date: Mar. 2, 2023

(65) Prior Publication Data

US 2024/0078978 A1 Mar. 7, 2024

(30) Foreign Application Priority Data

Aug. 25, 2021 (CN) ........................ 202110981437.8

(51) Int. Cl.
*G09G 3/3266* (2016.01)
*G09G 3/3233* (2016.01)
(Continued)

(52) U.S. Cl.
CPC ......... *G09G 3/3266* (2013.01); *G09G 3/3233* (2013.01); *G09G 3/3275* (2013.01);
(Continued)

(58) Field of Classification Search
CPC ........... H10K 59/1201; H10K 59/1213; H10K 59/38; H10K 59/1216; H10K 59/1315;
(Continued)

(56) References Cited

U.S. PATENT DOCUMENTS 6,657,230 B1 12/2003 Murade
2010/0096988 A1* 4/2010 Kitabayashi ..... H10K 59/80515 445/24

(Continued)

FOREIGN PATENT DOCUMENTS

CN 104267546 A 1/2015
CN 111554704 A 8/2020

(Continued)

*Primary Examiner* — Eric W Jones
(74) *Attorney, Agent, or Firm* — BROOKS KUSHMAN P.C.

(57) ABSTRACT

A display substrate including a base substrate and a plurality of pixel units on the base substrate. Each pixel unit includes: a plurality of sub-pixels and at least one scanning line. The plurality of sub-pixels are arranged sequentially in a first direction, each sub-pixels includes a sub-pixel driving circuit and a light-emitting element, and the sub-pixel driving circuit is coupled to the light-emitting element. Each scanning line includes a first scanning conductive layer and a second scanning conductive layer arranged in a laminated manner, the first scanning conductive layer is coupled to the second scanning conductive layer, the first scanning con-
(Continued)

ductive layer includes at least a portion extending in the first direction, and the first scanning conductive layer is coupled to a plurality of sub-pixel driving circuits in the plurality of sub-pixels.

19 Claims, 12 Drawing Sheets

(51) Int. Cl.
*G09G 3/3275* (2016.01)
*H10K 59/12* (2023.01)
*H10K 59/121* (2023.01)
*H10K 59/131* (2023.01)
*H10K 59/38* (2023.01)

(52) U.S. Cl.
CPC ..... *H10K 59/1201* (2023.02); *H10K 59/1213* (2023.02); *H10K 59/1216* (2023.02); *H10K 59/1315* (2023.02); *H10K 59/38* (2023.02); *G09G 2300/0842* (2013.01)

(58) Field of Classification Search
CPC .. G09G 3/3233; G09G 3/3275; G09G 3/3266; G09G 2300/0842
USPC .......................... 257/40, 59, 88, 91, 99, 100
See application file for complete search history.

(56) References Cited

U.S. PATENT DOCUMENTS

| | | | | |
|---|---|---|---|---|
| 2015/0187854 | A1* | 7/2015 | Beak | H10K 59/1213 438/23 |
| 2017/0133402 | A1 | 5/2017 | Ning et al. | |
| 2018/0033850 | A1* | 2/2018 | Gang | H10K 59/351 |
| 2018/0122882 | A1* | 5/2018 | Lee | H10D 86/60 |
| 2018/0157099 | A1* | 6/2018 | Cheng | H10D 30/6723 |
| 2019/0131369 | A1* | 5/2019 | Choi | H10D 30/6723 |
| 2020/0227499 | A1* | 7/2020 | Tang | H10K 59/126 |
| 2020/0258966 | A1 | 8/2020 | Cha et al. | |
| 2021/0359079 | A1* | 11/2021 | Jo | H10K 59/126 |
| 2022/0114958 | A1 | 4/2022 | Feng et al. | |
| 2022/0199677 | A1* | 6/2022 | Park | H10H 20/831 |
| 2023/0106915 | A1* | 4/2023 | Zhou | H10D 86/423 257/40 |

FOREIGN PATENT DOCUMENTS

| | | | |
|---|---|---|---|
| CN | 113690306 | A | 11/2021 |
| CN | 114207703 | A | 3/2022 |

* cited by examiner

DISPLAY SUBSTRATE HAVING SCANNING LINE WITH SCANNING CONDUCTIVE LAYERS ARRANGED IN LAMINATED MANNER, METHOD FOR MANUFACTURING THE SAME, AND DISPLAY DEVICE HAVING THE SAME

CROSS-REFERENCE TO RELATED APPLICATIONS

This application is the U.S. national phase of PCT Application No. PCT/CN2022/110479 filed on Aug. 5, 2022, which claims priority to Chinese Patent Application No. 202110981437.8 filed on Aug. 25, 2021, which are incorporated herein by reference in their entireties.

TECHNICAL FIELD

The present disclosure relates to the field of display technologies, in particular to a display substrate, a method for manufacturing the display substrate, and a display device.

BACKGROUND

An OLED (Organic Light-Emitting Diode) display device has been widely used in various fields due to such advantages as their light and thin, large brightness, low power consumption, fast response speeds, high definition, good flexibility and high luminous efficiency.

When the OLED display device is applied to the field of large-size and high-resolution, since the layout space of pixels is limited, and is affected by rules such as line width and line spacing, a RC (resistance-capacitance) loading of a signal line is too large, and thus the performance of the display device is adversely affected.

SUMMARY

An object of the present disclosure is to provide a display substrate, a method for manufacturing the display substrate, and a display device.

In order to achieve the above object, the present disclosure provides the following technical solutions.

In a first aspect, the present disclosure provides a display substrate including a base substrate and a plurality of pixel units on the base substrate. Each pixel unit includes:

- a plurality of sub-pixels arranged sequentially in a first direction, where each sub-pixel includes a sub-pixel driving circuit and a light-emitting element, and the sub-pixel driving circuit is coupled to the light-emitting element;
- at least one scanning line, where each scanning line includes a first scanning conductive layer and a second scanning conductive layer arranged in a laminated manner, the first scanning conductive layer is coupled to the second scanning conductive layer, the first scanning conductive layer includes at least a portion extending in the first direction, and the first scanning conductive layer is coupled to a plurality of sub-pixel driving circuits in the plurality of sub-pixels.

In a possible embodiment of the present disclosure, the pixel unit includes: a first scanning line and a second scanning line. An orthogonal projection of the first scanning line onto the base substrate and an orthogonal projection of the second scanning line onto the base substrate are arranged in a second direction crossing the first direction; a width of the first scanning conductive layer in the first scanning line in a direction perpendicular to an extending direction of the first scanning conductive layer in the first scanning line is greater than a width of the first scanning conductive layer in the second scanning line in a direction perpendicular to an extending direction of the first scanning conductive layer in the second scanning line.

In a possible embodiment of the present disclosure, the first scanning conductive layer in the first scanning line includes a first hollowed-out region.

In a possible embodiment of the present disclosure, the first scanning conductive layer in the second scanning line includes: a first scanning sub-pattern and a second scanning sub-pattern arranged alternately, a width of the first scanning sub-pattern in a direction perpendicular to the first direction is greater than a width of the second scanning sub-pattern in the direction perpendicular to the first direction, the width of the first scanning sub-pattern in the direction perpendicular to the first direction is less than the width of the first scanning conductive layer in the first scanning line in the direction perpendicular to the extending direction of the first scanning conductive layer in the first scanning line, and the first scanning sub-pattern includes a second hollowed-out region.

In a possible embodiment of the present disclosure, the second scanning conductive layer includes at least a portion extending in the first direction, an orthogonal projection of the second scanning conductive layer onto the base substrate is located within an orthogonal projection of the first scanning conductive layer onto the base substrate.

In a possible embodiment of the present disclosure, the second scanning conductive layer includes a plurality of second scanning patterns independent of each other, and the plurality of second scanning patterns is coupled to the first scanning conductive layer.

In a possible embodiment of the present disclosure, the pixel unit further includes a plurality of data lines corresponding to the sub-pixels respectively, where each data line includes a first data conductive layer and a second data conductive layer arranged in a laminated manner, the first data conductive layer is coupled to the second data conductive layer, the second data conductive layer includes at least a portion extending in the second direction crossing the first direction, and the second data conductive layer is coupled to a sub-pixel driving circuit in a corresponding sub-pixel.

In a possible embodiment of the present disclosure, the pixel unit further includes a first power source line including a first power source conductive layer and a second power source conductive layer arranged in a laminated manner, the first power source conductive layer being coupled to the second power source conductive layer, the second power source conductive layer including a portion extending in the second direction, and the second power source conductive layer being coupled to the sub-pixel driving circuit in the corresponding sub-pixel.

In a possible embodiment of the present disclosure, the pixel unit further includes a sensing line including a first sensing conductive layer and a second sensing conductive layer arranged in a laminated manner and coupled to each other, the second sensing conductive layer including a portion extending in the second direction, and the second sensing conductive layer being coupled to each sub-pixel driving circuit in the pixel unit.

In a possible embodiment of the present disclosure, the first scanning conductive layer, the first data conductive layer, the first power source conductive layer and the first sensing conductive layer are arranged at a same layer and made of a same material; the second scanning conductive layer, the second data conductive layer, the second power source conductive layer and the second sensing conductive layer are arranged at a same layer and made of a same material.

In a possible embodiment of the present disclosure, the sub-pixel driving circuit includes a storage capacitor, the storage capacitor includes a first transparent plate and a second transparent plate arranged oppositely, and the first transparent plate is located between the second transparent plate and the base substrate.

In a possible embodiment of the present disclosure, the sub-pixel driving circuit further includes:

a driving transistor, where a gate electrode of the driving transistor is coupled to the second transparent plate, a first electrode of the driving transistor is coupled to the first power source line, and a second electrode of the driving transistor is coupled to the first transparent plate and the light-emitting element; the driving transistor includes a driving active layer;

the second transparent plate is arranged at a same layer and made of a same material as the driving active layer.

In a possible embodiment of the present disclosure, the driving active layer includes a driving channel portion; the sub-pixel further includes a first conductive connection member through which the second electrode of the driving transistor is coupled to the first transparent plate and the light-emitting element, an orthogonal projection of the first conductive connection member onto the base substrate at least partially overlap an orthogonal projection of the driving channel portion onto the base substrate.

In a possible embodiment of the present disclosure, the sub-pixel driving circuit further includes:

a written-in transistor, where a gate electrode of the written-in transistor is coupled to the first scanning line, a first electrode of the written-in transistor is coupled to a corresponding data line, and a second electrode of the data written-in transistor is coupled to the gate electrode of the driving transistor;

a sensing transistor, a gate electrode of the sensing transistor being coupled to the second scanning line, a first electrode of the sensing transistor being coupled to the light-emitting element, and a second electrode of the sensing transistor being coupled to the sensing line.

In a possible embodiment of the present disclosure, a sensing transistor includes a sensing active layer, the written-in transistor includes a written-in active layer, and the sensing active layer, the second transparent plate and the written-in active layer are arranged sequentially in the second direction, and the second transparent plate and the written-in active layer are formed as one piece. The driving active layer and a part of the second transparent plate are arranged in the first direction.

In a possible embodiment of the present disclosure, the first transparent plate includes a first transparent portion and a second transparent portion arranged in the second direction, and a width of the first transparent portion in the first direction is less than a width of the second transparent portion in the first direction. The first transparent portion is coupled to the first electrode of the sensing transistor, an orthogonal projection of the first transparent portion onto the base substrate does not overlap an orthogonal projection of the second transparent plate onto the base substrate. An orthogonal projection of the second transparent portion onto the base substrate at least partially overlaps the orthogonal projection of the second transparent plate onto the base substrate, and the orthogonal projection of the second transparent portion onto the base substrate at least partially overlaps an orthogonal projection of the driving active layer onto the base substrate.

In a possible embodiment of the present disclosure, the pixel unit includes a first color filter layer, and an orthogonal projection of the first color filter layer onto the base substrate at least partially overlaps the orthogonal projection of the driving channel portion in each sub-pixel of the pixel unit onto the base substrate. The written-in active layer includes a written-in channel portion, and the orthogonal projection of the first color filter layer onto the base substrate at least partially overlaps an orthogonal projection of the written-in channel portion in each sub-pixel of the pixel unit onto the base substrate. The sensing active layer includes a sensing channel portion, and the orthogonal projection of the first color filter layer onto the base substrate at least partially overlaps an orthogonal projection of the sensing channel portion in each sub-pixel of the pixel unit onto the base substrate.

In a possible embodiment of the present disclosure, the first color filter layer includes: a first color filter pattern, a second color filter pattern and a third color filter pattern. At least a part of the first color filter pattern extends in the first direction. An orthogonal projection of the first color filter pattern onto the base substrate at least partially overlaps the orthogonal projection of the written-in channel portion in each sub-pixel of the pixel unit onto the base substrate. An orthogonal projection of the first color filter pattern onto the base substrate at least partially overlaps the orthogonal projection of the driving channel portion in each sub-pixel of the pixel unit onto the base substrate. At least a part of the second color filter pattern extends in the second direction. An orthogonal projection of the second color filter pattern onto the base substrate at least partially overlaps an orthogonal projection of a pixel opening region of a first sub-pixel in the pixel unit onto the base substrate. At least a part of the third color filter pattern extends in the first direction, an orthogonal projection of the third color filter pattern onto the base substrate at least partially overlaps the orthogonal projection of the sensing channel portion in each sub-pixel of the pixel unit onto the base substrate.

Based on the technical solution of the display substrate, in a second aspect, the present disclosure provides a display device including the above-mentioned display substrate.

Based on the technical solution of the display substrate, in a third aspect, the present disclosure provides a method for manufacturing a display substrate, including: fabricating a plurality of pixel units on a base substrate. The pixel unit includes:

a plurality of sub-pixels arranged sequentially in a first direction, where each sub-pixel includes a sub-pixel driving circuit and a light-emitting element, and the sub-pixel driving circuit is coupled to the light-emitting element;

at least one scanning line, where each scanning line includes a first scanning conductive layer and a second scanning conductive layer arranged in a laminated manner, the first scanning conductive layer is coupled to the second scanning conductive layer, the first scanning conductive layer includes at least a portion extending in the first direction, and the first scanning conductive layer is coupled to a plurality of sub-pixel driving circuits in the plurality of sub-pixels.

BRIEF DESCRIPTION OF THE DRAWINGS

The following drawings are provided to facilitate the understanding of the present disclosure, and constitute a portion of the present disclosure. These drawings and the following embodiments are for illustrative purposes only, but shall not be construed as limiting the present disclosure. In these drawings.

DETAILED DESCRIPTION

Figure 1:
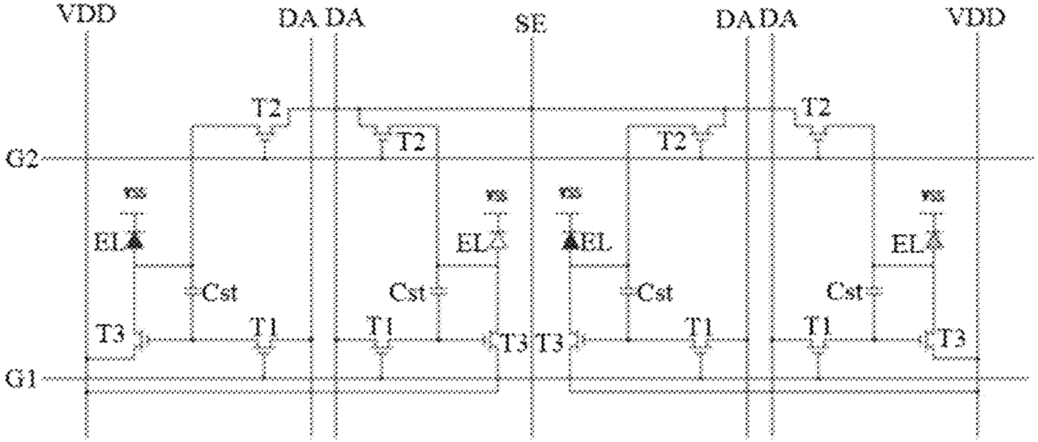
FIG. 1 is a schematic view showing a plurality of sub-pixel driving circuits corresponding to one pixel unit according to the embodiment of the present disclosure.

In order to further explain the display substrate, the method for manufacturing the same, and the display device provided by the embodiments of the present disclosure, a detailed description will be given below with reference to the accompanying drawings.

With reference to FIGS. 1-3, 5-7, 11 and 12, the present disclosure in some embodiments provides a display substrate, including: a base substrate 10 and a plurality of pixel units on the base substrate 10. Each pixel unit includes:

- a plurality of sub-pixels arranged sequentially in a first direction, where each sub-pixels includes a sub-pixel driving circuit and a light-emitting element (EL), and the sub-pixel driving circuit is coupled to the light-emitting element (EL);
- at least one scanning line, where each scanning line includes a first scanning conductive layer (e.g., denoted by G21 and G11) and a second scanning conducting layer (e.g., denoted by G22 and G12) arranged in a laminated manner, the first scanning conductive layer is coupled to the second scanning conductive layer, the first scanning conductive layer includes at least a portion extending in the first direction, the first scanning conductive layer is coupled to a plurality of sub-pixel driving circuits in the plurality of sub-pixels.

Illustratively, the plurality of pixel units is distributed in an array form on the base substrate 10. The plurality of pixel units may be divided into pixel units in multiple rows and pixel units in multiple columns, the pixel units in multiple rows are arranged in a second direction, and the pixel units in each row includes multiple pixel units arranged in the first direction. The pixel units in multiple columns are arranged in the first direction, and the pixel units in each column includes multiple pixel units arranged in the second direction.

Illustratively, the first direction includes a horizontal direction and the second direction includes a vertical direction.

Illustratively, the pixel unit includes a red sub-pixel, a green sub-pixel, a blue sub-pixel and a white sub-pixel.

Illustratively, the sub-pixel includes the sub-pixel driving circuit and the light-emitting element EL, the sub-pixel driving circuit is coupled to an anode of the light-emitting element EL, to provide a driving signal to the anode. Illustratively, the sub-pixel driving circuit includes, but not limited to, a 3T1C (i.e., 3 transistors and 1 capacitor) structure. A cathode of the light-emitting element EL receives a negative power source signal VSS.

Illustratively, the scanning line includes a first scanning conductive layer and a second scanning conductive layer arranged in a laminated manner, the first scanning conductive layer is located between the base substrate 10 and the second scanning conductive layer, an orthogonal projection of the first scanning conductive layer onto the base substrate 10 at least partially overlaps an orthogonal projection of the second scanning conductive layer onto the base substrate 10.

Illustratively, the orthogonal projection of the first scanning conductive layer onto the base substrate 10 overlaps the orthogonal projection of the second scanning conductive layer onto the base substrate 10 at an overlapping region, the first scanning conductive layer is coupled to the second scanning conductive layer through at least one via hole, an orthogonal projection of the at least one via hole onto the base substrate 10 is within the overlapping region.

Illustratively, the scanning line is used to transmit a scanning signal. The scanning line is coupled to a gate electrode of a corresponding transistor in the sub-pixel driving circuit, to transmit the scanning signal to the gate electrode of the corresponding transistor.

Illustratively, first scanning conductive layers of pixel units in the same row are coupled to each other, to form an integral structure.

According to the above-mentioned specific structure of the display substrate, in the display substrate of the embodiments of the present disclosure, when the scanning line includes the first scanning conductive layer and the second scanning conductive layer arranged in the laminated manner, it is able to reduce the resistance of the scanning line, thereby effectively reducing the load of the scanning line, and avoiding the delay in the scanning signal transmission of the scanning line. In this regard, it is able for the display substrate to be compatible with a high refresh rate, thereby to optimize the display effect, ensure the operation stability of the display substrate, and prolong the service life of the display substrate.

Referring to FIGS. 1-3, 5-7, 11 and 12, in some embodiments of the present disclosure, the pixel unit includes: a first scanning line G1 and a second scanning line G2.

Figure 11:
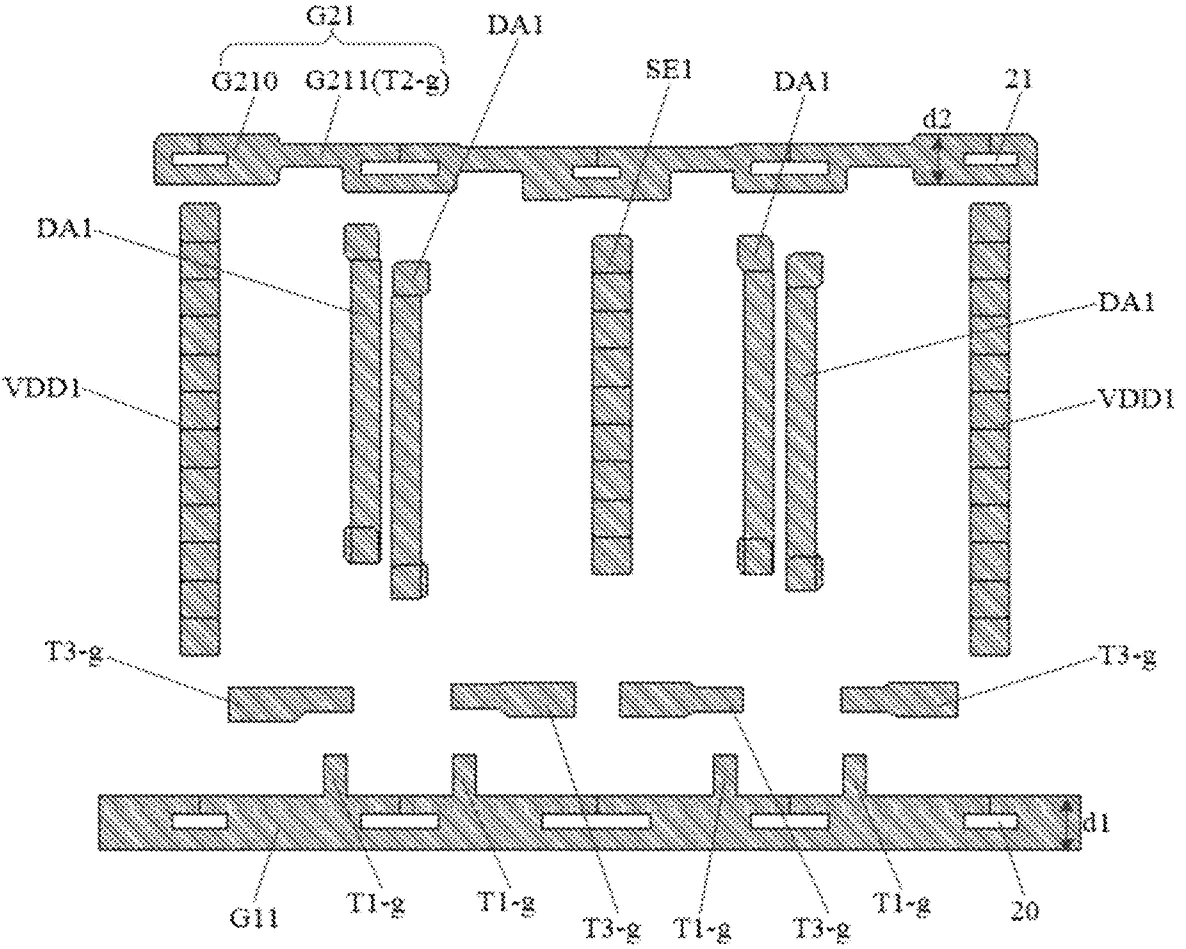
FIG. 11 is a schematic view showing the layout of the gate metal layer in FIG. 2.

As shown in FIG. 11, an orthogonal projection of the first scanning line G1 onto the base substrate 10 and an orthogonal projection of the second scanning line G2 onto the base substrate 10 are arranged in a second direction crossing the first direction. A width d1 of the first scanning conductive layer G11 in the first scanning line G1 in a direction perpendicular to an extending direction of the first scanning conductive layer G11 in the first scanning line is greater than a width d2 of the first scanning conductive layer G21 in the second scanning line G2 in a direction perpendicular to an extending direction of the first scanning conductive layer G21 in the second scanning line.

Illustratively, the first scanning line G1 and the second scanning line G2 each includes the first scanning conductive layer and the second scanning conductive layer arranged in a laminated manner.

Illustratively, a minimum width of the first scanning conductive layer G11 in the first scanning line G1 in the direction perpendicular to the extending direction of the first scanning conductive layer G11 is larger than a minimum width of the first scanning conductive layer G21 in the second scanning line G2 in the direction perpendicular to the extending direction of the first scanning conductive layer G21.

Illustratively, a maximum width of the first scanning conductive layer G11 in the first scanning line G1 in the direction perpendicular to the extending direction of the first scanning conductive layer G11 is larger than a maximum width of the first scanning conductive layer G21 in the second scanning line G2 in the direction perpendicular to the extending direction of the first scanning conductive layer G21.

Illustratively, a minimum width of the second scanning conductive layer G12 in the first scanning line G1 in a direction perpendicular to an extending direction of the second scanning conductive layer G12 is larger than a minimum width of the second scanning conductive layer G22 in the second scanning line G2 in a direction perpendicular to an extending direction of the second scanning conductive layer G22.

Illustratively, a maximum width of the second scanning conductive layer G12 in the first scanning line G1 in the direction perpendicular to the extending direction of the second scanning conductive layer G12 is larger than a maximum width of the second scanning conductive layer G22 in the second scanning line G2 in the direction perpendicular to the extending direction of the second scanning conductive layer G22.

Illustratively, a width of the second scanning conductive layer G12 in the first scanning line G1 in the direction perpendicular to the extending direction of the second scanning conductive layer G12 is larger than a width of the second scanning conductive layer G22 in the second scanning line G2 in the direction perpendicular to the extending direction of the second scanning conductive layer G22.

Illustratively, the first scanning line G1 is coupled to a gate electrode T1-*g* of a written-in transistor T1 in the sub-pixel driving circuit, and the second scanning line G2 is coupled to a gate electrode T2-*g* of a sensing transistor T2 in the sub-pixel driving circuit. When the second scanning line G2 transmits the second scanning signal, even a signal delay occurs, the light-emitting current generated by the sub-pixel driving circuit is slightly affected, which is even allowed to be ignored. When the occurrence of the delay during the case where the second scanning line G2 transmits the second scanning signal is simulated, and it has been found that it is able to ensure the uniformity of the light-emitting current to be greater than or equal to 99.8%.

When the first scanning line G1 and the second scanning line G2 each includes the first scanning conductive layer and the second scanning conductive layer arranged in a laminated manner, it is able to effectively reduce the load of the first scanning line G1 and the second scanning line G2, avoid the occurrence of delay during the case where the first scanning line G1 and the second scanning line G2 transmit scanning signals. As a result, it is able for the display substrate to be compatible with a high refresh rate, thereby to ensure the operation stability of the display substrate.

When the width of the first scanning conductive layer G11 in the first scanning line G1 and the width of the first scanning conductive layer G21 in the second scanning line G2 are set to be different, it is able to reduce the layout space occupied by the whole scanning line while reducing the load of the first scanning line G1 and the second scanning line G2, thereby effectively improving the pixel aperture ratio of the display substrate and providing technical support for realizing a large-size and high-resolution display substrate.

With reference to FIGS. 1-3, 5-7, 11 and 12, in some embodiments of the present disclosure, the first scanning conductive layer G11 in the first scanning line G1 includes a first hollowed-out region 20.

Illustratively, an orthogonal projection of the first hollowed-out region 20 onto the base substrate 10 at least partially overlaps orthogonal projections of other conductive structures in the display substrate onto the base substrate 10.

Illustratively, the first hollowed-out region 20 extends in the first direction.

Through the above-mentioned arrangement, it is able not only to reduce a parasitic capacitance formed between the first scanning conductive layer G11 in the first scanning line G1 and other conductive structures, but also to improve the light-exiting rate of the display substrate when the display substrate is a bottom-emission display substrate.

With reference to FIGS. 1-3, 5-7, 11 and 12, in some embodiments of the present disclosure, the first scanning conductive layer G21 in the second scanning line G2 includes: a first scanning sub-pattern G210 and a second scanning sub-pattern G211 arranged alternately, a width of the first scanning sub-pattern G210 in a direction perpendicular to the first direction is greater than a width of the second scanning sub-pattern G211 in the direction perpendicular to the first direction, the width of the first scanning sub-pattern G210 in the direction perpendicular to the first direction is less than the width of the first scanning conductive layer G11 in the first scanning line G1 in the direction perpendicular to the extending direction of the first scanning conductive layer G11 in the first scanning line, and the first scanning sub-pattern G210 includes a second hollowed-out region 21.

As shown in FIG. 11, illustratively, the second scanning sub-pattern G211 serves as a gate electrode of a corresponding transistor in the sub-pixel driving circuit to which it is coupled.

Illustratively, an orthogonal projection of the second hollowed-out region 21 onto the base substrate 10 at least partially overlaps the orthogonal projections of other conductive structures in the display substrate onto the base substrate 10.

Illustratively, the second hollowed-out region 21 extends in the first direction.

Through the above-mentioned arrangement, it is able not only to reduce a parasitic capacitance formed between the first scanning conductive layer G21 in the second scanning line G2 and other conductive structures, improves the pixel aperture ratio of the display substrate, but also to improve a light-exiting rate of the display substrate when the display substrate is a bottom-emission display substrate.

With reference to FIGS. 1-3, 5-7, 11 and 12, in some embodiments of the present disclosure, when the second scanning conductive layer includes at least a portion extending in the first direction, an orthogonal projection of the second scanning conductive layer onto the base substrate 10 is located within an orthogonal projection of the first scanning conductive layer onto the base substrate 10.

Through the above-mentioned arrangement, it is beneficial for reducing the layout space occupied by the whole scanning line, and improving the pixel aperture ratio and light-exiting rate of the display substrate.

Referring to FIGS. 1-3, 5-7, 11 and 12, in some embodiments of the present disclosure, the second scanning conductive layer (e.g., denoted by G22 and G12) includes a plurality of second scanning patterns G220 that are independent of each other and coupled to the first scanning conductive layer (e.g., denoted by G21 and G11).

Illustratively, the plurality of second scanning patterns G220 is arranged sequentially in the first direction.

Illustratively, an orthogonal projection of each second scanning pattern G220 onto the base substrate 10 is located within the orthogonal projection of the corresponding first scanning conductive layer onto the base substrate 10.

Illustratively, the orthogonal projection of the second scanning conductive layer onto the base substrate 10 does not overlap the orthogonal projection of the hollowed-out region in the first scanning conductive layer onto the base substrate 10.

When the second scanning conductive layer includes the plurality of second scanning patterns G220 independent of each other, it is able not only to effectively reduce the load of the scanning line, but also to avoid an excessive parasitic capacitance formed between the first scanning conductive layer and the second scanning conductive layer.

As shown in FIGS. 1-3, 5-7, 11 and 12, in some embodiments of the present disclosure, the pixel unit further includes: a plurality of data lines DA corresponding to the sub-pixels respectively, where each the data line DA includes a first data conductive layer DA1 and a second data conductive layer DA2 arranged in a laminated manner, the first data conductive layer DA1 is coupled to the second data conductive layer DA2, the second data conductive layer DA2 includes at least a portion extending in the second direction crossing the first direction, and the second data conductive layer DA2 is coupled to a sub-pixel driving circuit in a corresponding sub-pixel.

Illustratively, the data line DA includes the first data conductive layer DA1 and the second data conductive layer DA2 arranged in the laminated manner, the first data conductive layer DA1 is located between the base substrate 10 and the second data conductive layer DA2, an orthogonal projection of the first data conductive layer DA1 onto the base substrate 10 at least partially overlaps an orthogonal projection of the second data conductive layer DA2 onto the base substrate 10.

Illustratively, the orthogonal projection of the first data conductive layer DA1 onto the base substrate 10 overlaps the orthogonal projection of the second data conductive layer DA2 onto the base substrate 10 at an overlapping region, the first data conductive layer DA1 is coupled to the second data conductive layer DA2 through at least one via hole, an orthogonal projection of the at least one via hole onto the base substrate 10 is within the overlapping region. Illustratively, the first data conductive layer DA1 is coupled to the second data conductive layer DA2 through a plurality of via holes arranged sequentially in the second direction.

Illustratively, the data line DA is used for transmitting data signals. The data line DA is coupled to a corresponding transistor in the sub-pixel driving circuit, to transmit the data signal to the corresponding transistor.

Illustratively, of the pixel units in a same column, sub-pixels in a column in the second direction are coupled to the corresponding second data conductive layer DA2, to form an integral structure.

Illustratively, the first data conductive layer DA1 includes at least a portion extending in the second direction.

According to the above-mentioned specific structure of the display substrate, in the display substrate of the embodiments of the present disclosure, when the data line DA includes the first data conductive layer DA1 and the second data conductive layer DA2 arranged in a laminated manner, it is able to reduce the resistance of the data line DA, thereby effectively reducing the load of the data line DA, and avoiding the delay in the data signal transmission of the data line DA. As a result, it is able for the display substrate to be compatible with a high refresh rate, thereby to ensure the operation stability of the display substrate.

As shown in FIGS. 1-3, 5-7, 11 and 12, in some embodiments of the present disclosure, the pixel unit further includes: a first power source line VDD including a first power source conductive layer VDD1 and a second power source conductive layer VDD2 arranged in a laminated manner, the first power source conductive layer VDD1 is coupled to the second power source conductive layer VDD2, the second power source conductive layer VDD2 includes a portion extending in the second direction, and the second power source conductive layer VDD2 is coupled to the sub-pixel driving circuit in the corresponding sub-pixel.

Illustratively, the first power source line VDD includes the first power source conductive layer VDD1 and the second power source conductive layer VDD2 arranged in the laminated manner, the first power source conductive layer VDD1 is located between the base substrate 10 and the second power source conductive layer VDD2, an orthogonal projection of the first power source conductive layer VDD1 onto the base substrate 10 at least partially overlaps an orthogonal projection of the second power source conductive layer VDD2 onto the base substrate 10.

Illustratively, the orthogonal projection of the first power conductive layer VDD1 onto the base substrate 10 overlaps the orthogonal projection of the second power conductive layer VDD2 onto the base substrate 10 at an overlapping region, the first power conductive layer VDD1 is coupled to the second power conductive layer VDD2 through at least one via hole, an orthogonal projection of the at least one via hole onto the base substrate 10 is within the overlapping region. Illustratively, the first power conductive layer VDD1 is coupled to the second power conductive layer VDD2 through a plurality of via holes arranged sequentially in the second direction.

Illustratively, the first power source line VDD is used for transmitting a power signal. The first power source line VDD is coupled to a corresponding transistor in the sub-pixel driving circuit, to transmit the power source signal to the corresponding transistor.

Illustratively, second power source conductive layers VDD2 of the pixel units in the same column are coupled to each other, to form an integral structure.

Illustratively, the first power conductive layer VDD1 includes at least a portion extending in a second direction.

According to the above-mentioned specific structure of the display substrate, in the display substrate of the embodiments of the present disclosure, when the first power source line VDD includes the first power source conductive layer VDD1 and the second power source conductive layer VDD2 arranged in a laminated manner, it is able to reduce the resistance of the first power source line VDD, thereby effectively reducing the load of the first power source line VDD, reducing the IR Drop and ensuring the operation stability of the display substrate.

As shown in FIGS. 1-3, 5-7, 11 and 12, in some embodiments of the present disclosure, the pixel unit further includes: a sensing line SE including a first sensing conductive layer SE1 and a second sensing conductive layer SE2 arranged in a laminated manner and coupled to each other, the second sensing conductive layer SE2 includes a portion extending in the second direction, and the second sensing conductive layer SE2 is coupled to each sub-pixel driving circuit in the pixel unit.

Illustratively, the sensing line SE includes the first sensing conductive layer SE1 and the second sensing conductive layer SE2 arranged in the laminated manner, the first sensing conductive layer SE1 is located between the base substrate 10 and the second sensing conductive layer SE2, an orthogonal projection of the first sensing conductive layer SE1 onto the base substrate 10 at least partially overlaps an orthogonal projection of the second sensing conductive layer SE2 onto the base substrate 10.

Illustratively, the orthogonal projection of the first sensing conductive layer SE1 onto the base substrate 10 overlaps the orthogonal projection of the second sensing conductive layer SE2 onto the base substrate 10 at an overlapping region, the first sensing conductive layer SE1 is coupled to the second sensing conductive layer SE2 through at least one via hole, an orthogonal projection of the at least one via hole onto the base substrate 10 is within the overlapping region. Illustratively, the first sensing conductive layer SE1 is coupled to the second sensing conductive layer SE2 through a plurality of via holes arranged sequentially in the second direction.

Illustratively, the sensing line SE is used to transmit a sensing signal. The sensing line SE is coupled to a corresponding transistor in the sub-pixel driving circuit.

Illustratively, second sensing conductive layers SE2 of the pixel units in the same column are coupled to each other, to form an integral structure.

Illustratively, the first sensing conductive layer SE1 includes at least a portion extending in a second direction.

According to the above-mentioned specific structure of the display substrate, in the display substrate of the embodiments of the present disclosure, when the sensing line SE includes the first sensing conductive layer SE1 and the second sensing conductive layer SE2 arranged in the laminated manner, it is able to reduce the resistance of the sensing line SE, thereby effectively reducing the load of the sensing line SE and ensuring the operation stability of the display substrate.

Figure 5:
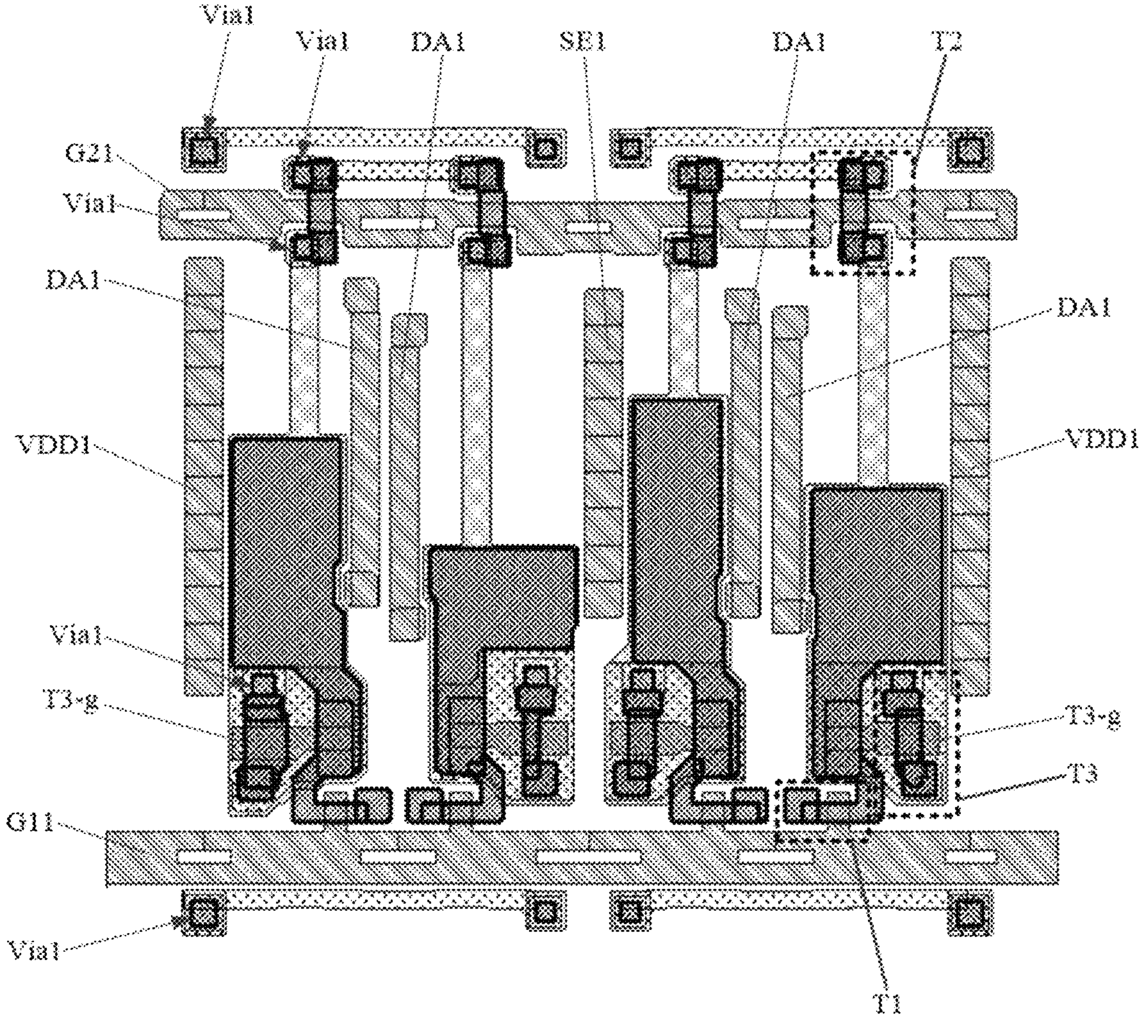
FIG. 5 is a schematic view showing the layout of a case where a gate metal layer is added into FIG. 4.
Figure 6:
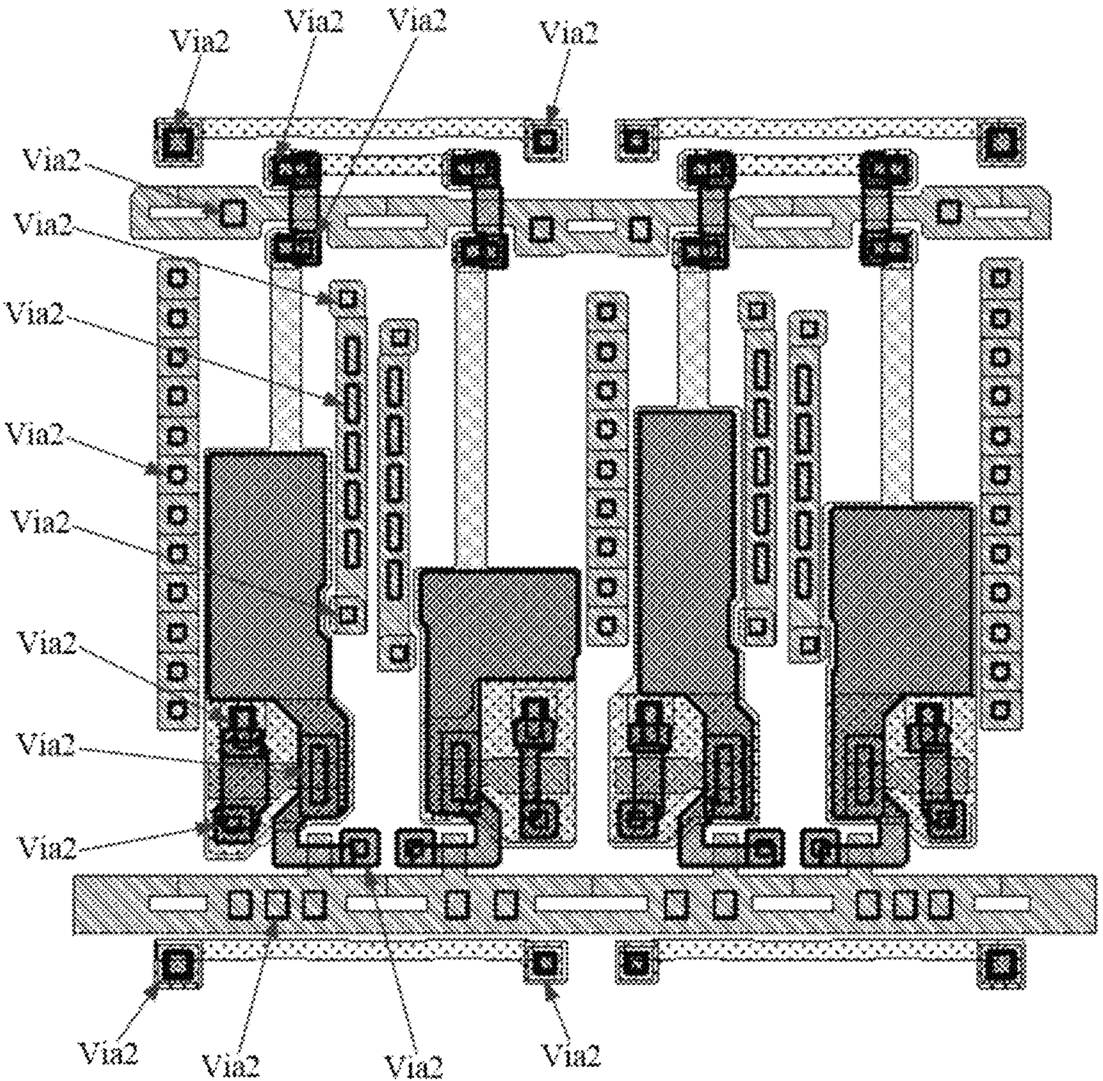
FIG. 6 is a schematic view showing the layout of a case where a via hole in an interlayer insulating layer is added into FIG. 5.
Figure 7:
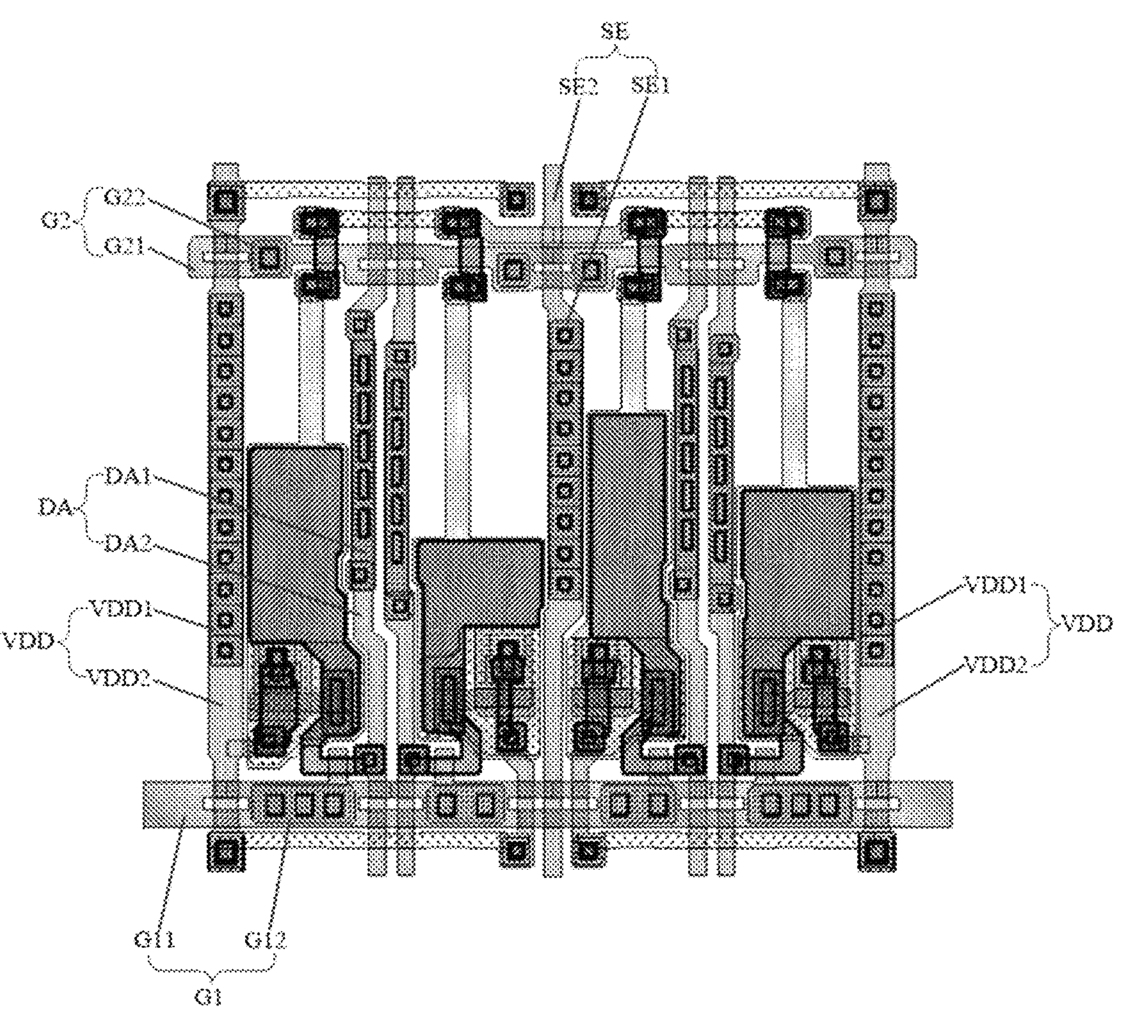
FIG. 7 is a schematic view showing the layout of a case where a source/drain metal layer is added into FIG. 6.

FIG. 5 shows a via hole Via1 formed in a CNT via hole process. FIG. 6 shows a via hole Via2 formed in an interlayer insulating layer.

Figure 12:
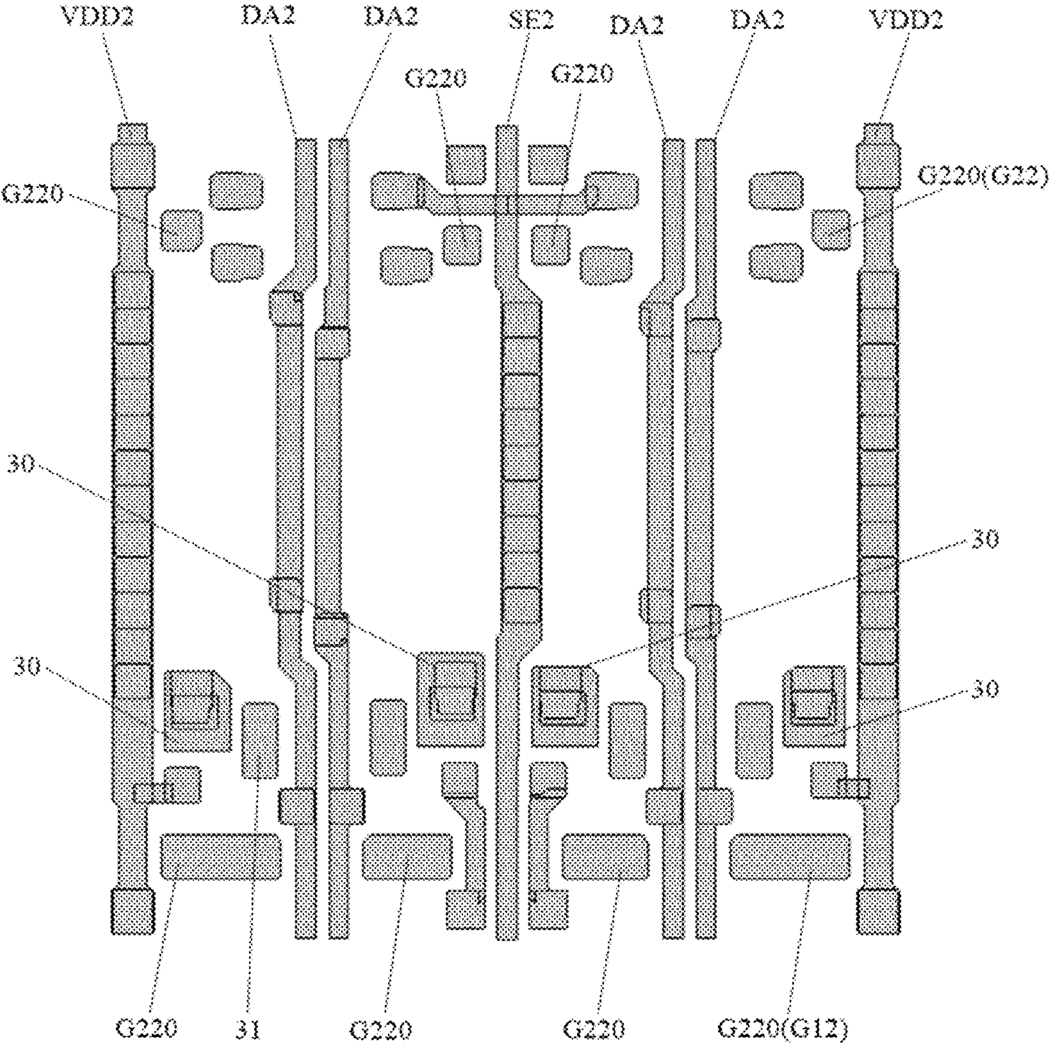
FIG. 12 is a schematic view showing the layout of the source/drain metal layer in FIG. 2.
Figure 13:
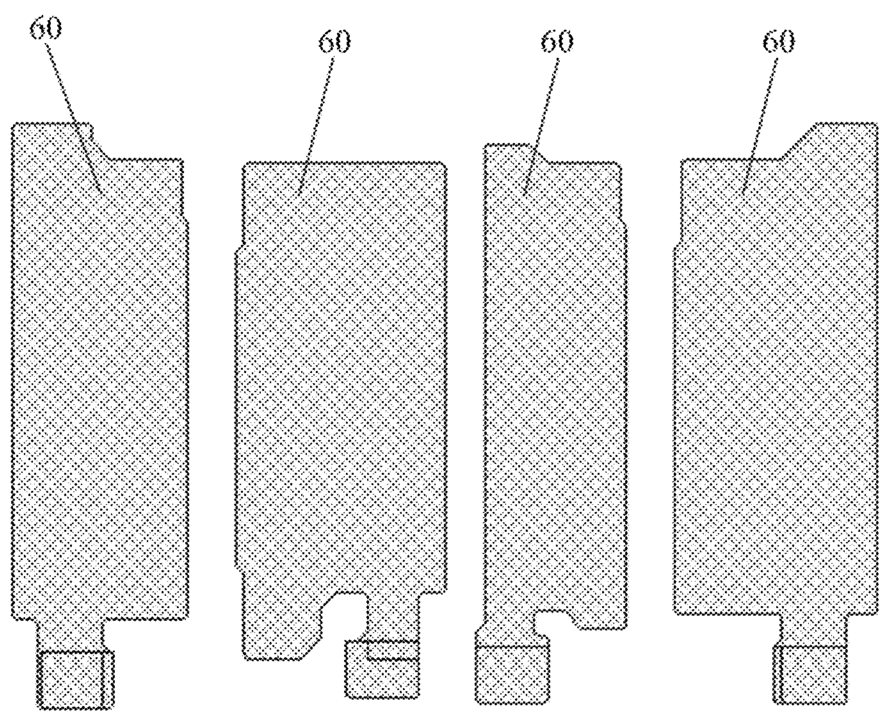
FIG. 13 is a schematic view showing the layout of an anode layer in FIG. 2.

As shown in FIGS. 11 and 12, in some embodiments of the present disclosure, the first scanning conductive layer, the first data conductive layer DA1, the first power source conductive layer VDD1 and the first sensing conductive layer SE1 are arranged at a same layer and made of a same material; the second scanning conductive layer, the second data conductive layer DA2, the second power source conductive layer VDD2 and the second sensing conductive layer SE2 are arranged at a same layer and made of a same material.

Figure 14:
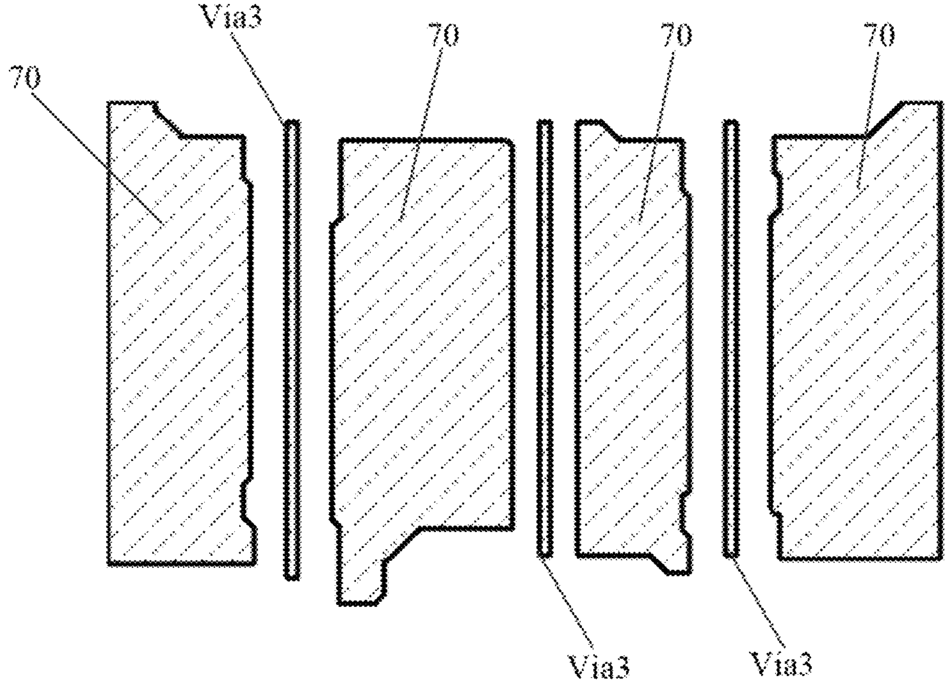
FIG. 14 is a schematic view showing the layout of a pixel definition layer in FIG. 2.

As shown in FIGS. 3 and 8-15, by way of example, the display substrate includes a 1ITO (indium tin oxide) layer, a light shielding layer 50, a buffer layer BUF, an active layer, a gate insulating layer 80, a gate metal layer, an interlayer insulating layer ILD, a source/drain metal layer, a passivation layer PVX, a color filter layer, a planarization layer 81, an anode layer 60, a pixel definition layer PDL, a light-emitting functional layer 84 and a cathode layer 83 laminated one on another in a direction away from the base substrate 10. As shown in FIG. 14, the pixel definition layer PDL is capable of defining a pixel opening region 70.

Illustratively, the pixel definition layer PDL is provided with a via hole Via3, at least a part of the via hole Via3 is located between adjacent pixel opening regions 70, and the via hole Via3 is filled with the cathode layer 83, so as to effectively avoid lateral light leakage.

Illustratively, the anode layer is made of an ITO material.

It should be appreciated that 11 mask processes are required for manufacturing the display substrate. After forming the interlayer insulating layer, a CNT process is performed firstly to form a half via hole in the interlayer insulating layer without penetrating the interlayer insulating layer, and then a mask process is performed on the interlayer insulating layer to form a via hole penetrating the interlayer insulating layer.

Illustratively, the gate metal layer is used to form the first scanning conductive layer, the first data conductive layer DA1, the first power source conductive layer VDD1 and the first sensing conductive layer SE1. The source/drain metal layers is used to form the second scanning conductive layer, the second data conductive layer DA2, the second power source conductive layer VDD2 and the second sensing conductive layer SE2.

Through the above-mentioned arrangement, it is able to enable the first scanning conductive layer, the first data conductive layer DA1, the first power source conductive layer VDD1 and the first sensing conductive layer SE1 to be formed simultaneously through a same patterning process, and enable the second scanning conductive layer, the second data conductive layer DA2, the second power source conductive layer VDD2 and the second sensing conductive layer SE2 to be formed simultaneously in a same patterning process, without any additional patterning process, thereby to simplify the manufacturing process procedure of the display substrate and reduce the manufacturing cost of the display substrate.

In the display substrate of the above-mentioned embodiments, it is able to effectively reduce the load of each signal line without any new additional process.

As shown in FIGS. 1-4, 8 and 10, in some embodiments of the present disclosure, the sub-pixel driving circuit includes a storage capacitor Cst including a first transparent plate Cst1 and a second transparent plate Cst2 arranged opposite to each other, the first transparent plate Cst1 is located between the second transparent plate Cst2 and the base substrate 10.

Illustratively, the first transparent plate Cst1 is coupled to a second electrode of the driving transistor T3 and the second transparent plate Cst2 is coupled to a gate electrode T3-*g* of the driving transistor T3.

Illustratively, the first transparent plate Cst1 is formed by using the 1ITO layer.

Illustratively, an orthogonal projection of the first transparent plate Cst1 onto the base substrate at least partially overlaps the orthogonal projection of the pixel opening region of the corresponding sub-pixel onto the base substrate 10. An orthogonal projection of the second transparent plate Cst2 onto the base substrate at least partially overlaps the orthogonal projection of the pixel opening region of the corresponding sub-pixel onto the base substrate 10.

When the storage capacitor Cst includes the first transparent plate Cst1 and the second transparent plate Cst2 arranged opposite to each other, it is able to effectively improve the light-exiting rate of the display substrate.

As shown in FIGS. 1 to 5, 8 and 10, in some embodiments of the present disclosure, the sub-pixel driving circuit further includes: a driving transistor T3, where a gate electrode T3-*g* of the driving transistor T3 is coupled to the second transparent plate Cst2, a first electrode of the driving transistor T3 is coupled to the first power source line VDD, and a second electrode of the driving transistor T3 is coupled to the first transparent plate Cst1 and the light-emitting element EL. The driving transistor T3 includes a driving active layer T3-*s*. The second transparent plate Cst2 is arranged at a same layer and made of a same material as the driving active layer T3-*s*.

As shown in FIG. 12, the sub-pixel further includes a second conductive connection member 31 coupled to the gate electrode T3-*g* of the driving transistor T3 and an active layer for forming a written-in active layer T1-*s* and the second transparent plate Cst2.

Illustratively, the active layer is made of a transparent material. Illustratively, the active layer is made of a transparent metal oxide material.

When the second transparent plate Cst2 and the driving active layer T3-*s* are arranged at the same layer and made of the same material, it is able to enable the second transparent plate Cst2 and the driving active layer T3-*s* to be formed through a same patterning process, thereby effectively simplifying the manufacturing process procedure of the display substrate and reducing the manufacturing cost of the display substrate.

As shown in FIGS. 5 and 10-12, in some embodiments of the present disclosure, the driving active layer T3-*s* includes a driving channel portion T3-*s*0. The sub-pixel further includes a first conductive connection member 30, the second electrode of the driving transistor T3 is coupled to the first transparent plate Cst1 and the light-emitting element EL through the first conductive connection member 30, and an orthogonal projection of the first conductive connection member 30 onto the base substrate 10 at least partially overlaps an orthogonal projection of the driving channel portion T3-*s*0 onto the base substrate 10.

Illustratively, the first conductive connection member 30 is arranged at a same layer and made of a same material as the source/drain metal layer.

Illustratively, the first conductive connection member 30 is coupled to the second electrode of the driving transistor T3, the first transparent plate is coupled to the anode of the light-emitting element EL.

Illustratively, at least a part of the driving active layer T3-*s* extends in the second direction.

Illustratively, the driving active layer T3-*s* includes the driving channel portion T3-*s*0, including a portion for forming the first electrode of the driving transistor T3, and a portion for forming the second electrode of the driving transistor T3. The orthogonal projection of the driving channel portion T3-*s*0 onto the base substrate 10 is located within the orthogonal projection of the gate electrode T3-*g* of the driving transistor T3 onto the base substrate 10.

Figure 3:
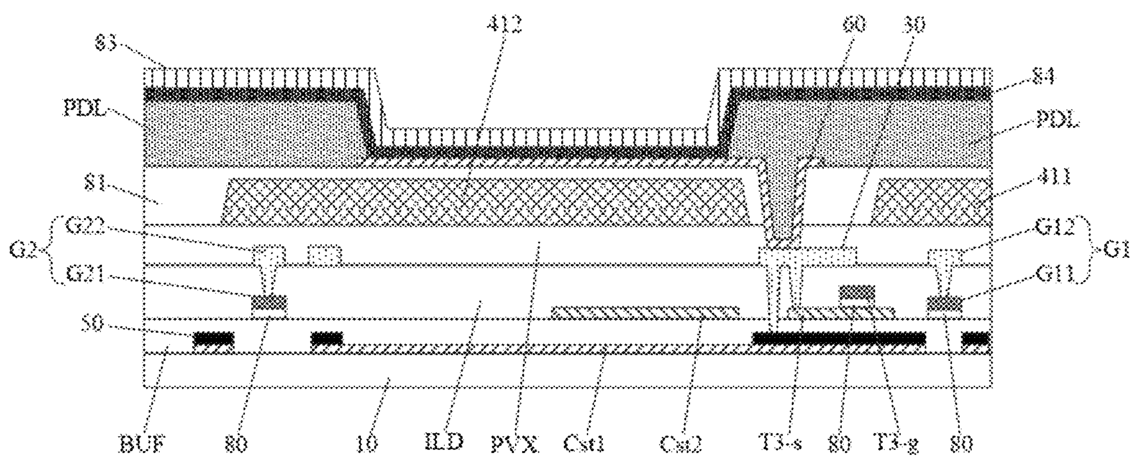
FIG. 3 is a cross-sectional view of the plurality of sub-pixel driving circuits corresponding to one pixel unit in FIG. 2 along line A1-A2.

As shown in FIG. 3, the first conductive connection member 30 is coupled to the first transparent plate Cst1 through the light shielding layer 50.

When the orthogonal projection of the first conductive connection member 30 onto the base substrate 10 at least partially overlaps the orthogonal projection of the driving channel portion T3-*s*0 onto the base substrate 10, it is able to effectively reduce the influence of light leakage on the driving transistor T3, thereby to ensure the operation stability of the driving transistor T3.

As shown in FIGS. 1-3, 5 and 11, in some embodiments of the present disclosure, the sub-pixel driving circuit further includes:

- a written-in transistor T1, where a gate electrode T1-*g* of the written-in transistor T1 is coupled to the first scanning line G1, a first electrode of the written-in transistor T1 is coupled to a corresponding data line DA, and a second electrode of the data written-in transistor T1 is coupled to the gate electrode T3-*g* of the driving transistor T3;
- a sensing transistor T2, where a gate electrode T2-*g* of the sensing transistor T2 is coupled to the second scanning line G2, a first electrode of the sensing transistor T2 is coupled to the light-emitting element EL, and a second electrode of the sensing transistor T2 is coupled to the sensing line SE.

Illustratively, both the written-in transistor T1 and the sensing transistor T2 function as switching transistors.

Illustratively, the written-in transistor T1 is turned on or off under the control of a first scanning signal from the first scanning line G1. The sensing transistor T2 is turned on or off under the control of a second scanning signal from the second scanning line G2.

Illustratively, the sub-pixel driving circuit includes the 3T1C structure and two scanning lines.

Through reducing the load of the first scanning line G1, it is able to avoid the occurrence of delay during the case where the first scanning line G1 transmits the first scanning signal, and ensure the charging rate of applying the data signal to the gate electrode T3-*g* of the driving transistor T3 through the data line DA, thereby to enable the display substrate to meet the requirement on high refresh rate.

Through reducing the load of the second scanning line G2, it is able to avoid the occurrence of the delay during the case where the second scanning line G2 transmits the second scanning signal, thereby to adequately ensure the transmission of the sensing signal.

As shown in FIGS. 2, 5 and 10-12, in some embodiments of the present disclosure, the sensing transistor T2 includes a sensing active layer T2-*s*, the written-in transistor T1 includes a written-inactive layer T1-*s*, and the sensing active layer T2-*s*, the second transparent plate Cst2 and the written-in active layer T1-*s* are arranged sequentially in the second direction, and the second transparent plate Cst2 and the written-in active layer T1-*s* are formed as one piece. The driving active layer T3-*s* and a part of the second transparent plate Cst2 are arranged in the first direction.

Illustratively, the sensing active layer T2-*s* includes at least a portion extending in the second direction. The written-in active layer T1-*s* includes at least a portion extending in the first direction.

Illustratively, in a same sub-pixel, the orthogonal projection of at least a part of the second transparent plate Cst2 onto the base substrate 10 is located between an orthogonal projection of the sensing active layer T2-*s* onto the base substrate 10 and an orthogonal projection of the written-in active layer T1-*s* onto the base substrate 10.

Illustratively, the driving active layer T3-*s* and a part of the second transparent plate Cst2 are arranged in the first direction, and the driving active layer T3-*s* and another part of the second transparent plate Cst2 are arranged in the second direction.

Illustratively, the sensing active layer T2-*s*, the written-in active layer T1-*s*, the driving active layer T3-*s* and the second transparent plate Cst2 are arranged at a same layer and made of a same material.

Through the above-mentioned arrangement, it is beneficial for reducing the layout space occupied by the sub-pixel driving circuit, reducing a difficulty in the arrangement of the sub-pixel driving circuit, and improving the resolution of the display substrate.

Figure 4:
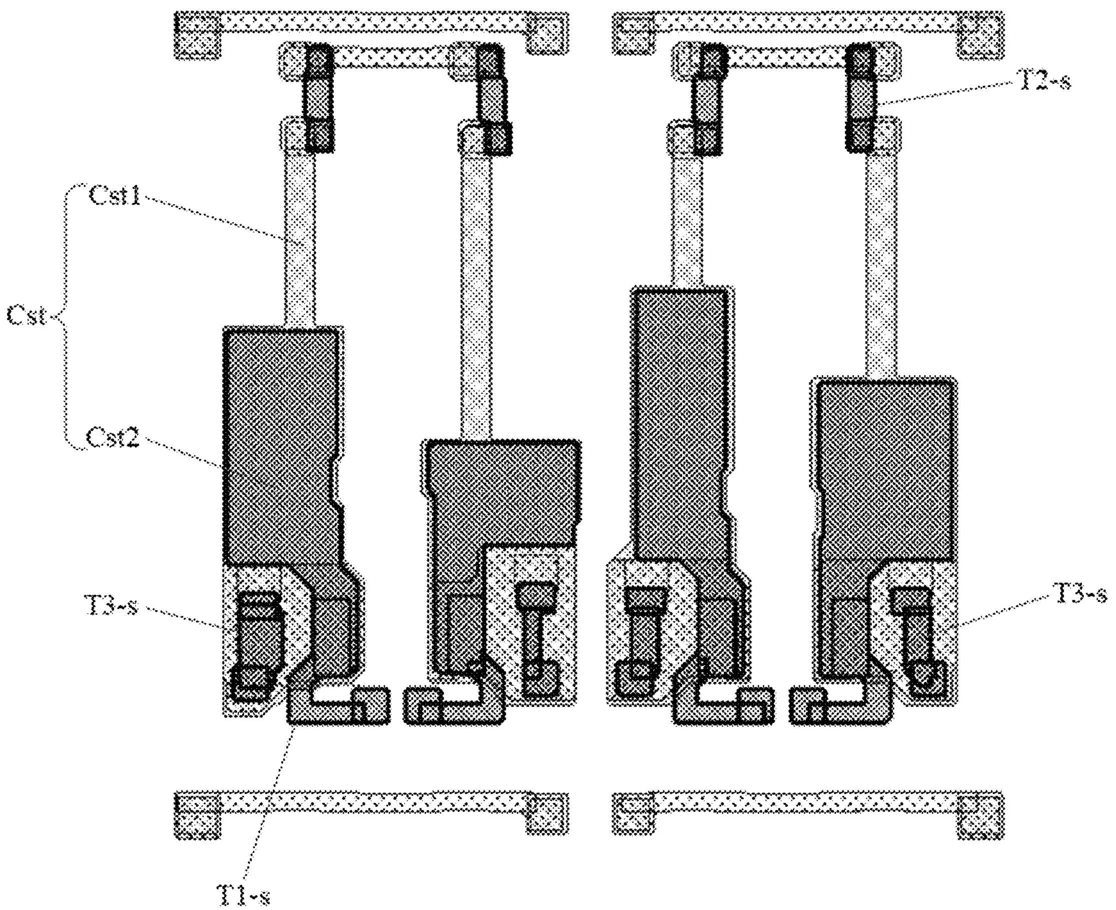
FIG. 4 is a schematic view showing the layout of a light shielding layer, a 1ITO layer and an active layer in FIG. 2.
Figure 8:
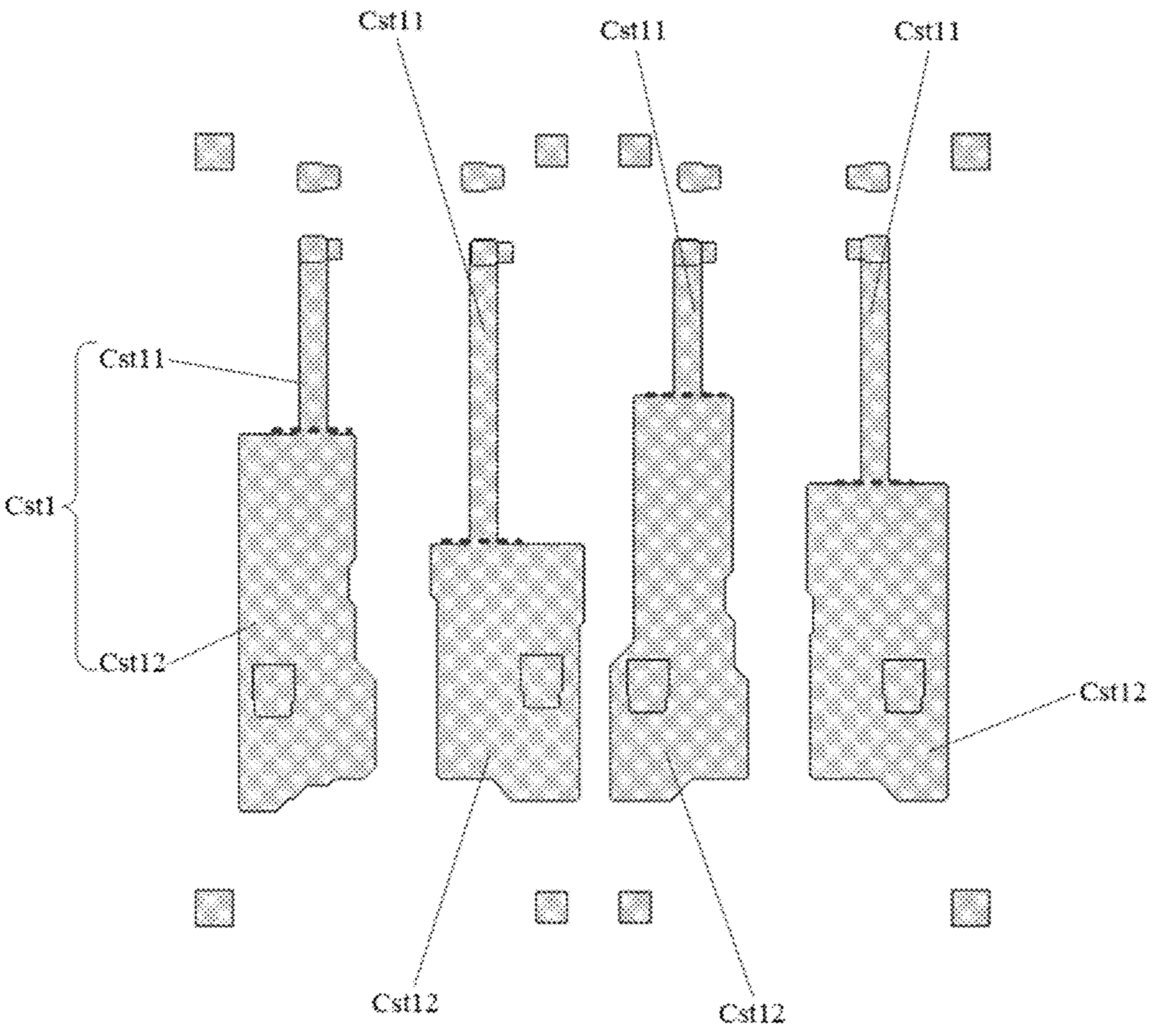
FIG. 8 is a schematic view showing the layout of 1ITO in FIG. 2.

As shown in FIGS. 4, 5 and 8, in some embodiments of the present disclosure, the first transparent plate Cst1 includes a first transparent portion Cst11 and a second transparent portion Cst12 arranged in the second direction, a width of the first transparent portion Cst11 in the first direction is less than a width of the second transparent portion Cst12 in the first direction.

The first transparent portion Cst11 is coupled to the first electrode of the sensing transistor T2, and an orthogonal projection of the first transparent portion Cst11 onto the base substrate 10 does not overlap an orthogonal projection of the second transparent plate Cst2 onto the base substrate 10;

An orthogonal projection of the second transparent portion Cst12 onto the base substrate 10 at least partially overlaps the orthogonal projection of the second transparent plate Cst2 onto the base substrate 10, and the orthogonal projection of the second transparent portion Cst12 onto the base substrate 10 at least partially overlaps an orthogonal projection of the driving active layer T3-*s* onto the base substrate 10.

Illustratively, the first transparent portion Cst11 and the second transparent portion Cst12 are formed as one piece.

Illustratively, the first transparent portion Cst11 includes a strip-like structure extending in the second direction.

Illustratively, the orthogonal projection of the second transparent plate Cst2 onto the base substrate 10 is located within the orthogonal projection of the second transparent portion Cst12 onto the base substrate 10.

Illustratively, the orthogonal projection of the driving active layer T3-*s* onto the base substrate 10 is located within the orthogonal projection of the second transparent portion Cst12 onto the base substrate 10.

Through the above-mentioned arrangement, it is able to effectively increase the storage capacitor Cst, thereby to ensure the operation stability of the sub-pixel driving circuit.

When the width of the first transparent portion Cst11 in the first direction is less than the width of the second transparent portion Cst12 in the first direction, it is able to effectively reduce the shielding of the pixel opening region by the first transparent plate Cst1, thereby to improve the light-exiting rate of the display substrate.

Figure 9:
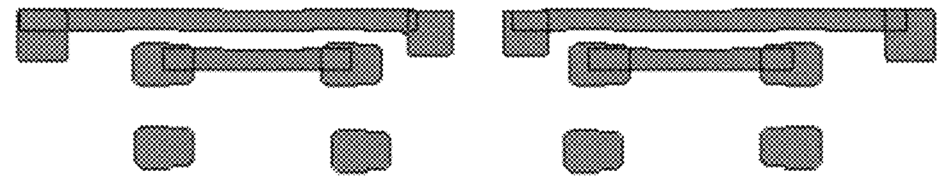
FIG. 9 is a schematic view showing the layout of the light shielding layer in FIG. 2.
Figure 9:
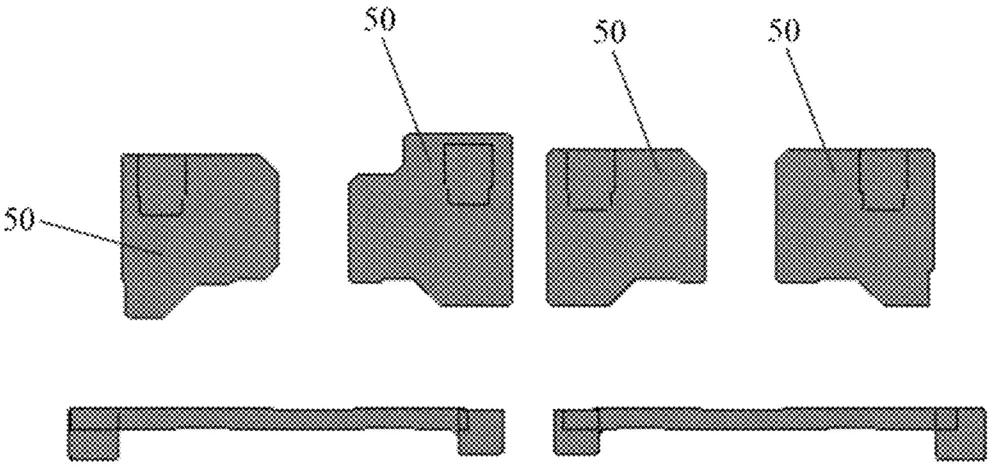
Figure 10:
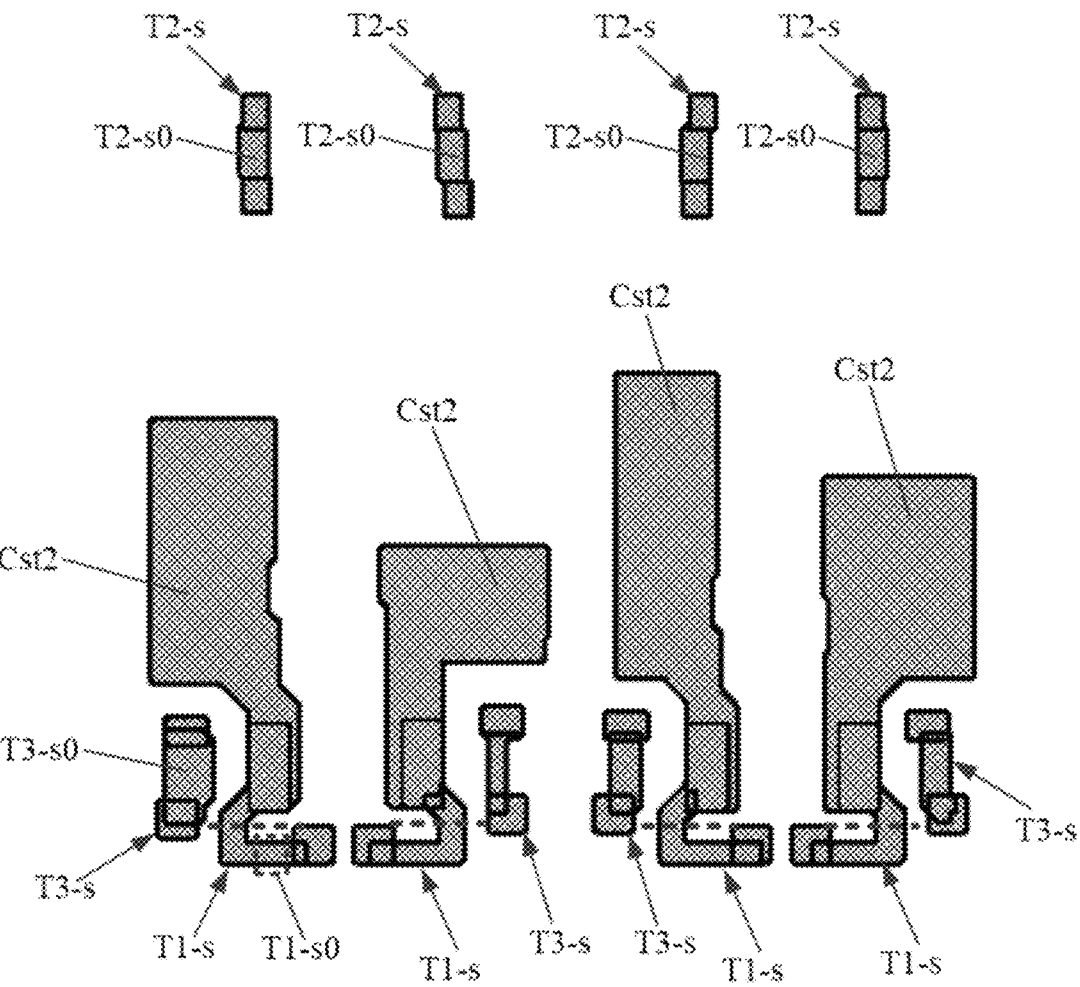
FIG. 10 is a schematic view showing the layout of the active layer in FIG. 2.

As shown in FIG. 9, in some embodiments of the present disclosure, the sub-pixel further includes the light shielding layer 50 including a first light shielding pattern, and an orthogonal projection of the first light shielding pattern onto the base substrate 10 at least partially overlaps the orthogonal projection of the driving active layer T3-*s* onto the base substrate 10.

Through the above-mentioned arrangement, it is able to effectively reduce the influence of light leakage on the driving transistor T3, thereby to ensure the operation stability of the driving transistor T3.

Figure 2:
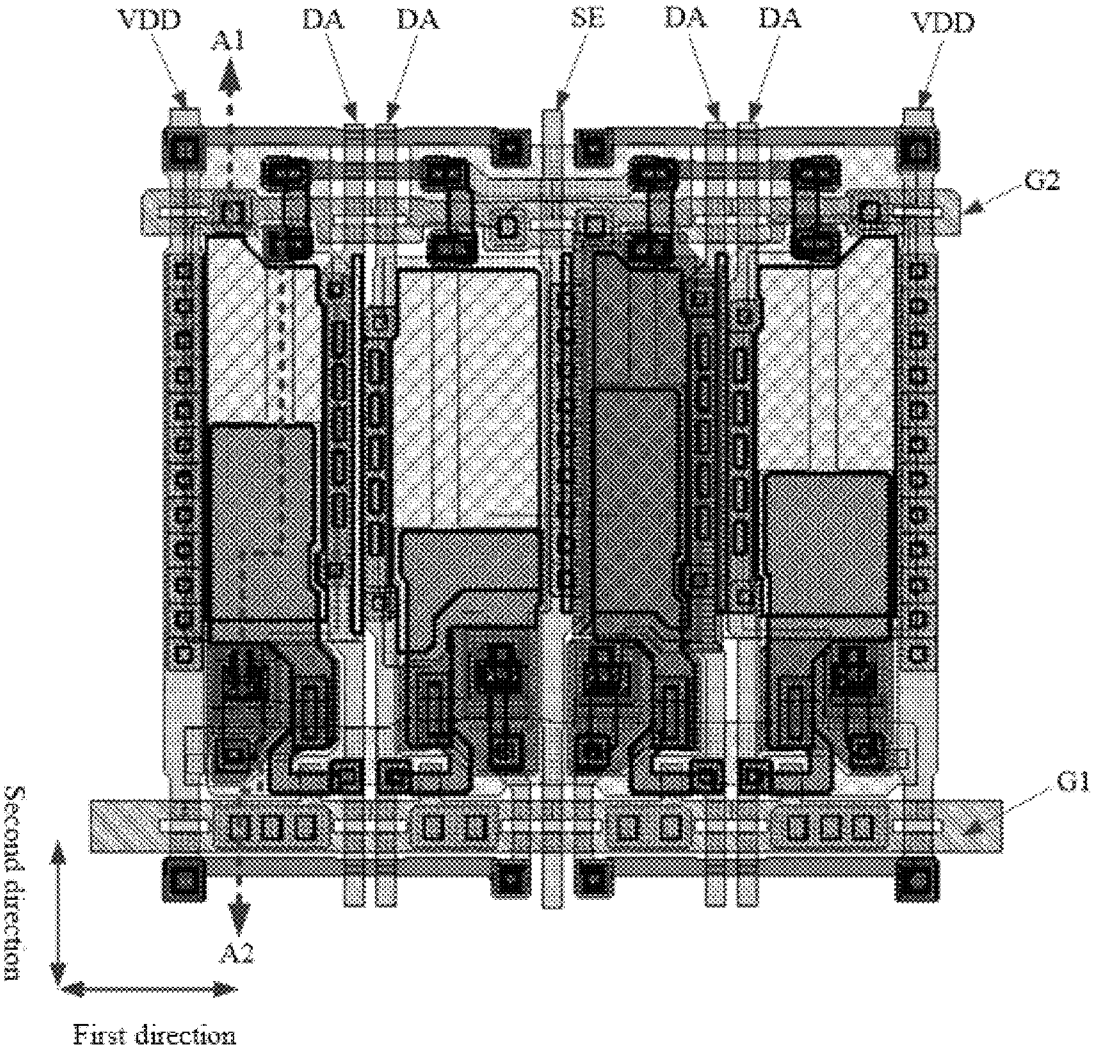
FIG. 2 is a schematic view showing the layout of the plurality of sub-pixel driving circuits corresponding to one pixel unit according to the embodiment of the present disclosure.
Figure 15:
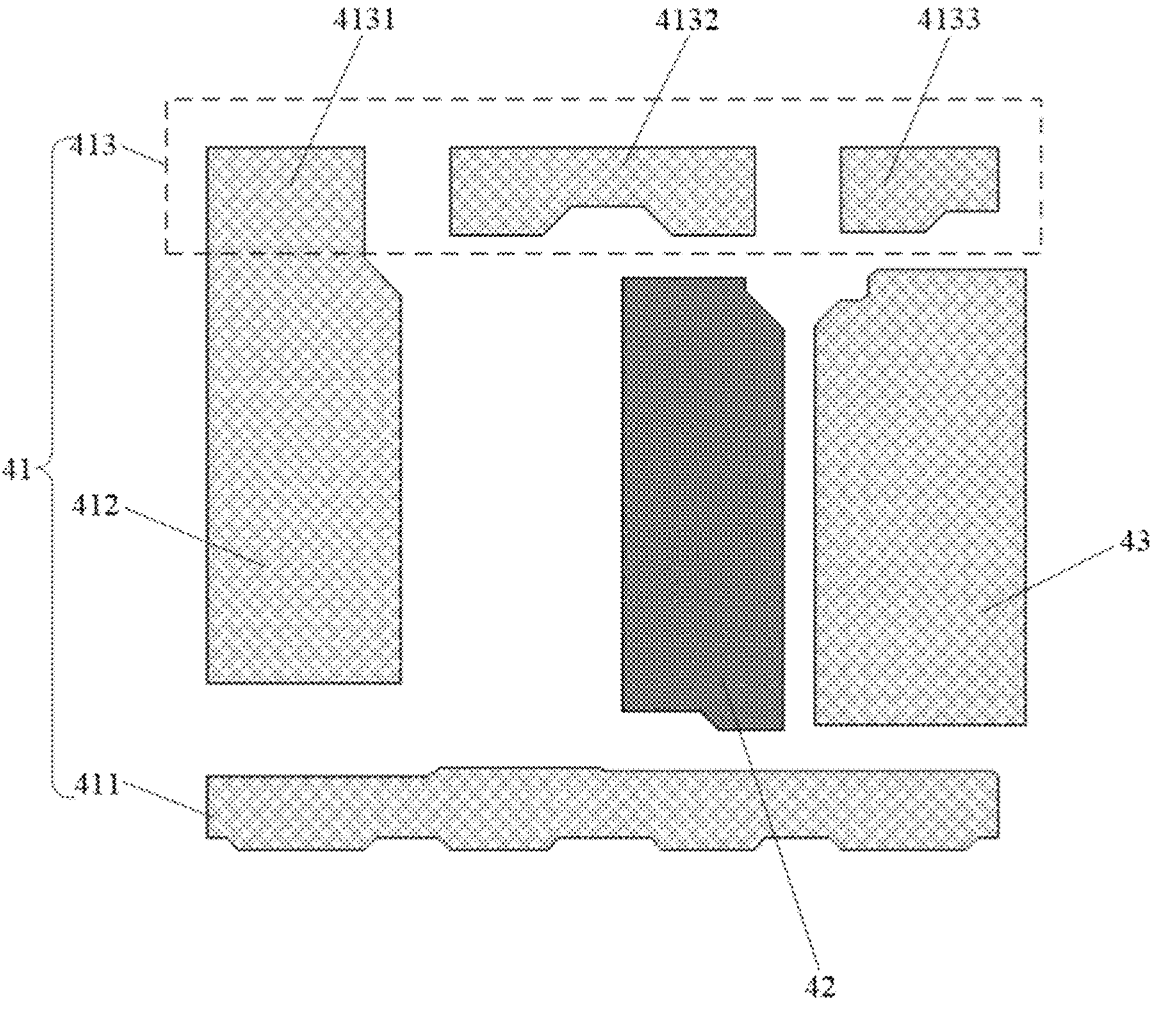
FIG. 15 is a schematic view showing the layout of a color filter layer in FIG. 2.

As shown in FIGS. 2, 3 and 15, in some embodiments of the present disclosure, the pixel unit includes a first color filter layer 41, an orthogonal projection of the first color filter layer 41 onto the base substrate 10 at least partially overlaps the orthogonal projection of the driving channel portion T3-*s*0 in each sub-pixel of the pixel unit onto the base substrate 10.

The written-in active layer T1-*s* includes a written-in channel portion T1-*s*0, and the orthogonal projection of the first color filter layer 41 onto the base substrate 10 at least partially overlaps an orthogonal projection of the written-in channel portion T1-*s*0 in each sub-pixel of the pixel unit onto the base substrate 10.

The sensing active layer T2-*s* includes a sensing channel portion T2-*s*0, and the orthogonal projection of the first color filter layer 41 onto the base substrate 10 at least partially overlaps an orthogonal projection of the sensing channel portion T2-*s*0 in each sub-pixel of the pixel unit onto the base substrate 10.

Illustratively, the pixel unit includes the first color filter layer 41 including a red color filter layer, a second color filter layer 42 including a green color filter layer, and a third color filter layer 43 including a blue color filter layer. An orthogonal projection of the red color filter layer onto the base substrate 10 at least partially overlaps an orthogonal projection of a pixel opening region of a red sub-pixel onto the base substrate 10, an orthogonal projection of the green color filter layer onto the base substrate 10 at least partially overlaps an orthogonal projection of a pixel opening region of a green sub-pixel onto the base substrate 10, and an orthogonal projection of the blue color filter layer onto the base substrate 10 at least partially overlaps an orthogonal projection of a pixel opening region of a blue sub-pixel onto the base substrate 10.

Illustratively, the second color filter layer 42 includes at least a portion extending in the second direction, and the third color filter layer 43 includes at least a portion extending in the second direction.

When the orthogonal projection of the first color filter layer 41 onto the base substrate 10 at least partially overlaps the orthogonal projection of the driving channel portion T3-*s*0 onto the base substrate 10, the orthogonal projection of the written-in channel portion T1-*s*0 onto the base substrate 10 and the orthogonal projection of the sensing channel portion T2-*s*0 onto the base substrate 10, it is able to effectively reduce the influence of light leakage on the driving transistor T3, the written-in transistor T1 and the sensing transistor T2, thereby ensuring the operation stability of the sub-pixel driving circuit.

As shown in FIGS. 2, 3, and 15, in some embodiments of the present disclosure, the first color filter layer 41 includes: a first color filter pattern 411, a second color filter pattern 412 and a third color filter pattern 413.

At least a part of the first color filter pattern 411 extends in the first direction, an orthogonal projection of the first color filter pattern 411 onto the base substrate 10 at least partially overlaps the orthogonal projection of the written-in channel portion T1-*s*0 in each sub-pixel of the pixel unit onto the base substrate 10, and the orthogonal projection of the first color filter pattern 411 onto the base substrate 10 at least partially overlaps the orthogonal projection of the driving channel portion T3-*s*0 in each sub-pixel of the pixel unit onto the base substrate 10.

At least a part of the second color filter pattern 412 extends in the second direction, an orthogonal projection of the second color filter pattern 412 onto the base substrate 10 at least partially overlaps an orthogonal projection of a pixel opening region of a first sub-pixel in the pixel unit onto the base substrate 10.

At least a part of the third color filter pattern 413 extends in the first direction, an orthogonal projection of the third color filter pattern 413 onto the base substrate 10 at least partly overlaps the orthogonal projection of the sensing channel portion T2-*s*0 in each sub-pixel of the pixel unit onto the base substrate 10.

Illustratively, the first color filter pattern 411 and the second color filter pattern 412 are independent of each other.

Illustratively, the second color filter pattern 412 and the third color filter pattern 413 are formed as one piece.

Illustratively, the second color filter pattern 412 and the third color filter pattern 413 are independent of each other.

Illustratively, the third color filter pattern 413 includes a first sub-pattern 4131, a second sub-pattern 4132 and a third sub-pattern 4133 which are independent from each other. The first sub-pattern 4131 and the second color filter pattern 412 are formed as one piece, and an orthogonal projection of the first sub-pattern 4131 onto the base substrate 10 at least partially overlaps the orthogonal projection of the sensing channel portion T2-*s*0 in the first sub-pixel of the pixel unit onto the base substrate 10. An orthogonal projection of the second sub-pattern 4132 onto the base substrate 10 at least partially overlaps the orthogonal projection of the sensing channel portion T2-*s*0 in a second sub-pixel of the pixel unit onto the base substrate 10. An orthogonal projection of the second sub-pattern 4132 onto the base substrate 10 at least partially overlaps the orthogonal projection of the sensing channel portion T2-*s*0 in a third sub-pixel of the pixel unit onto the base substrate 10. An orthogonal projection of the third sub-pattern 4133 onto the base substrate 10 at least partially overlaps the orthogonal projection of the sensing channel portion T2-*s*0 in a fourth sub-pixel in the pixel unit onto the base substrate 10.

Due to the above-mentioned arrangement, it is able to in reduce the difficulty in the arrangement and maintenance of the color filter layer.

The present disclosure further provides in some embodiments a display device including the above-mentioned display substrate.

Illustratively, the display device includes an oversized, high resolution and bottom-emission OLED display device.

It should be appreciated that, the display device may be any product or member having a display function, e.g., television, display, digital photo frame, mobile phone or tablet computer. The display device further includes a flexible circuit board, a printed circuit board and a back panel.

In the display substrate of the embodiment of the present disclosure, when the scanning line includes the first scanning conductive layer and the second scanning conductive layer arranged in a laminated manner, it is able to reduce the resistance of the scanning line, thereby effectively reducing the load of the scanning line, and avoiding the delay in the scanning signal transmission of the scanning line. As a result, it is able for the display substrate to be compatible with compatible with a high refresh rate, thereby to ensure the operation stability of the display substrate.

Hence, when the display device includes the above-mentioned display substrate, it also has the above-mentioned beneficial effects, which will not be particularly defined herein.

The present disclosure further provides in some embodiments a method for manufacturing a display substrate, including: fabricating a plurality of pixel units on a base substrate 10, the pixel unit including:

a plurality of sub-pixels arranged sequentially in a first direction, where each sub-pixels includes a sub-pixel driving circuit and a light-emitting element (EL), and the sub-pixel driving circuit is coupled to the light-emitting element (EL);

at least one scanning line, where each scanning line includes a first scanning conductive layer and a second scanning conductive layer arranged in a laminated manner, the first scanning conductive layer is coupled to the second scanning conductive layer, the first scanning conductive layer includes at least a portion extending in the first direction, and the first scanning conductive layer is coupled to a plurality of sub-pixel driving circuits in the plurality of sub-pixels.

According to the display substrate manufactured through the method in the embodiments of the present disclosure, the scanning line includes the first scanning conductive layer and the second scanning conductive layer arranged in a laminated manner, it is able to reduce the resistance of the scanning line, thereby effectively reducing the load of the scanning line, and avoiding the delay in the scanning signal transmission of the scanning line. As a result, it is able for the display substrate to be compatible with a high refresh frequency, thereby to ensure the operation stability of the display substrate.

It should be appreciated that, the expression "at a same layer" refers to that the film layers are arranged on a same structural layer. Alternatively, for example, the film layers on a same layer may be layer structures formed through forming thin layers for forming specific patterns through a single film-forming process and then patterning the film layers with a same mask through a single patterning process. Depending on different specific patterns, a single patterning process may include multiple exposure, development or etching processes, and the specific patterns in the layer structures may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner, and the relevant part may refer to the description of the product embodiment.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims.

What is claimed is:

1. A display substrate, comprising: a base substrate and a plurality of pixel units on the base substrate; wherein each pixel unit comprises:

a plurality of sub-pixels arranged sequentially in a first direction, wherein each sub-pixel comprises a sub-pixel driving circuit and a light-emitting element, and the sub-pixel driving circuit is coupled to the light-emitting element;

a plurality of scanning lines, wherein each scanning line comprises a first scanning conductive layer and a second scanning conductive layer arranged in a laminated manner, the first scanning conductive layer is coupled to the second scanning conductive layer, the first scanning conductive layer comprises at least a portion extending in the first direction, and the first scanning conductive layer is coupled to a plurality of sub-pixel driving circuits in the plurality of sub-pixels;

wherein the plurality of scanning lines comprises a first scanning line and a second scanning line;

an orthogonal projection of the first scanning line onto the base substrate and an orthogonal projection of the second scanning line onto the base substrate are arranged in a second direction crossing the first direction; a minimum width of a first scanning conductive layer in the first scanning line in a direction perpendicular to an extending direction of the first scanning conductive layer in the first scanning line is greater than a minimum width of a first scanning conductive layer in the second scanning line in a direction perpendicular to an extending direction of the first scanning conductive layer in the second scanning line;

a maximum width of the first scanning conductive layer in the first scanning line in the direction perpendicular to the extending direction of the first scanning conductive layer is greater than a maximum width of the first scanning conductive layer in the second scanning line in the direction perpendicular to the extending direction of the first scanning conductive layer;

a width of a second scanning conductive layer in the first scanning line in a direction perpendicular to an extending direction of the second scanning conductive layer is greater than a width of the second scanning conductive layer in the second scanning line in a direction perpendicular to an extending direction of the second scanning conductive layer.

2. The display substrate according to claim 1, wherein the first scanning conductive layer in the first scanning line comprises a first hollowed-out region.

3. The display substrate according to claim 1, wherein the first scanning conductive layer in the second scanning line comprises: a first scanning sub-pattern and a second scanning sub-pattern arranged alternately, a width of the first scanning sub-pattern in a direction perpendicular to the first direction is greater than a width of the second scanning sub-pattern in the direction perpendicular to the first direction, the width of the first scanning sub-pattern in the direction perpendicular to the first direction is less than the width of the first scanning conductive layer in the first scanning line in the direction perpendicular to the extending direction of the first scanning conductive layer in the first scanning line, and the first scanning sub-pattern comprises a second hollowed-out region.

4. The display substrate according to claim 1, wherein the second scanning conductive layer comprises at least a portion extending in the first direction, an orthogonal projection of the second scanning conductive layer onto the base substrate is located within an orthogonal projection of the first scanning conductive layer onto the base substrate.

5. The display substrate according to claim 1, wherein the second scanning conductive layer comprises a plurality of second scanning patterns independent of each other, and the plurality of second scanning patterns is coupled to the first scanning conductive layer.

6. The display substrate according to claim 1, wherein each pixel unit further comprises:

a plurality of data lines corresponding to the plurality of sub-pixels respectively, wherein each data line comprises a first data conductive layer and a second data conductive layer arranged in a laminated manner, the first data conductive layer is coupled to the second data conductive layer, the second data conductive layer comprises at least a portion extending in the second direction crossing the first direction, and the second data conductive layer is coupled to a sub-pixel driving circuit in a corresponding sub-pixel.

7. The display substrate according to claim 6, wherein each pixel unit further comprises:

a first power source line comprising a first power source conductive layer and a second power source conductive layer arranged in a laminated manner, the first power source conductive layer being coupled to the second power source conductive layer, the second power source conductive layer comprising a portion extending in the second direction, and the second power source conductive layer being coupled to the sub-pixel driving circuit in the corresponding sub-pixel.

8. The display substrate according to claim 7, wherein each pixel unit further comprises:

a sensing line comprising a first sensing conductive layer and a second sensing conductive layer arranged in a laminated manner and coupled to each other, the second sensing conductive layer comprising a portion extending in the second direction, and the second sensing conductive layer being coupled to each sub-pixel driving circuit in each pixel unit.

9. The display substrate according to claim 8, wherein the first scanning conductive layer, the first data conductive layer, the first power source conductive layer and the first sensing conductive layer are arranged at a same layer and made of a same material; the second scanning conductive layer, the second data conductive layer, the second power source conductive layer and the second sensing conductive layer are arranged at a same layer and made of a same material.

10. The display substrate according to claim 8, wherein the sub-pixel driving circuit comprises a storage capacitor comprising a first transparent plate and a second transparent plate arranged opposite to each other, and the first transparent plate is located between the second transparent plate and the base substrate.

11. The display substrate according to claim 10, wherein the sub-pixel driving circuit further comprises:

a driving transistor, wherein a gate electrode of the driving transistor is coupled to the second transparent plate, a first electrode of the driving transistor is coupled to the first power source line, and a second electrode of the driving transistor is coupled to the first transparent plate and the light-emitting element; the driving transistor comprises a driving active layer;

the second transparent plate is arranged at a same layer and made of a same material as the driving active layer.

12. The display substrate according to claim 11, wherein the driving active layer comprises a driving channel portion; the sub-pixel further comprises a first conductive connection member through which the second electrode of the driving transistor is coupled to the first transparent plate and the light-emitting element, an orthogonal projection of the first conductive connection member onto the base substrate at least partially overlaps an orthogonal projection of the driving channel portion onto the base substrate.

13. The display substrate according to claim 12, wherein the sub-pixel driving circuit further comprises:

a written-in transistor, wherein a gate electrode of the written-in transistor is coupled to the first scanning line, a first electrode of the written-in transistor is coupled to a corresponding data line, and a second electrode of the data written-in transistor is coupled to the gate electrode of the driving transistor;

a sensing transistor, wherein a gate electrode of the sensing transistor is coupled to the second scanning line, a first electrode of the sensing transistor is coupled to the light-emitting element, and a second electrode of the sensing transistor is coupled to the sensing line.

14. The display substrate according to claim 13, wherein the sensing transistor comprises a sensing active layer, the written-in transistor comprises a written-in active layer, and the sensing active layer, the second transparent plate and the written-in active layer are arranged sequentially in the second direction, and the second transparent plate and the written-in active layer are formed as one piece;

the driving active layer and a part of the second transparent plate are arranged in the first direction.

15. The display substrate according to claim 14, wherein the first transparent plate comprises a first transparent portion and a second transparent portion arranged in the second direction, and a width of the first transparent portion in the first direction is less than a width of the second transparent portion in the first direction;

the first transparent portion is coupled to the first electrode of the sensing transistor, an orthogonal projection of the first transparent portion onto the base substrate does not overlap an orthogonal projection of the second transparent plate onto the base substrate;

an orthogonal projection of the second transparent portion onto the base substrate at least partially overlaps the orthogonal projection of the second transparent plate onto the base substrate, and the orthogonal projection of the second transparent portion onto the base substrate at least partially overlaps an orthogonal projection of the driving active layer onto the base substrate.

16. The display substrate according to claim 14, wherein each pixel unit comprises a first color filter layer, and an orthogonal projection of the first color filter layer onto the base substrate at least partially overlaps the orthogonal projection of the driving channel portion in each sub-pixel of each pixel unit onto the base substrate;

the written-in active layer comprises a written-in channel portion, and the orthogonal projection of the first color filter layer onto the base substrate at least partially overlaps an orthogonal projection of the written-in channel portion in each sub-pixel of each pixel unit onto the base substrate;

the sensing active layer comprises a sensing channel portion, and the orthogonal projection of the first color filter layer onto the base substrate at least partially overlaps an orthogonal projection of the sensing channel portion in each sub-pixel of each pixel unit onto the base substrate.

17. The display substrate according to claim 16, wherein the first color filter layer comprises: a first color filter pattern, a second color filter pattern and a third color filter pattern;

at least a part of the first color filter pattern extends in the first direction; an orthogonal projection of the first color filter pattern onto the base substrate at least partially overlaps the orthogonal projection of the written-in channel portion in each sub-pixel of each pixel unit onto the base substrate; the orthogonal projection of the first color filter pattern onto the base substrate at least partially overlaps the orthogonal projection of the driving channel portion in each sub-pixel of each pixel unit onto the base substrate;

at least a part of the second color filter pattern extends in the second direction; an orthogonal projection of the second color filter pattern onto the base substrate at least partially overlaps an orthogonal projection of a pixel opening region of a first sub-pixel in each pixel unit onto the base substrate;

at least a part of the third color filter pattern extends in the first direction, an orthogonal projection of the third color filter pattern onto the base substrate at least partially overlaps the orthogonal projection of the sensing channel portion in each sub-pixel of each pixel unit onto the base substrate.

18. A display device comprising the display substrate according to claim 1.

19. A method for manufacturing a display substrate, comprising:

fabricating a plurality of pixel units on a base substrate, each pixel unit comprising:

a plurality of sub-pixels arranged sequentially in a first direction, wherein each sub-pixels comprises a sub-pixel driving circuit and a light-emitting element, and the sub-pixel driving circuit is coupled to the light-emitting element;

a plurality of scanning lines, wherein each scanning line comprises a first scanning conductive layer and a second scanning conductive layer arranged in a laminated manner, the first scanning conductive layer is coupled to the second scanning conductive layer, the first scanning conductive layer comprises at least a portion extending in the first direction, and the first scanning conductive layer is coupled to a plurality of sub-pixel driving circuits in the plurality of sub-pixels;

wherein the plurality of scanning lines comprises a first scanning line and a second scanning line;

an orthogonal projection of the first scanning line onto the base substrate and an orthogonal projection of the second scanning line onto the base substrate are arranged in a second direction crossing the first direction; a minimum width of a first scanning conductive layer in the first scanning line in a direction perpendicular to an extending direction of the first scanning conductive layer in the first scanning line is greater than a minimum width of a first scanning conductive layer in the second scanning line in a direction perpendicular to an extending direction of the first scanning conductive layer in the second scanning line;

a maximum width of the first scanning conductive layer in the first scanning line in the direction perpendicular to the extending direction of the first scanning conductive layer is greater than a maximum width of the first scanning conductive layer in the second scanning line in the direction perpendicular to the extending direction of the first scanning conductive layer;

a width of a second scanning conductive layer in the first scanning line in a direction perpendicular to an extending direction of the second scanning conductive layer is greater than a width of the second scanning conductive layer in the second scanning line in a direction perpendicular to an extending direction of the second scanning conductive layer.

* * * * *